United States Patent
Valeska Lotsch et al.

(10) Patent No.: US 12,407,045 B2
(45) Date of Patent: Sep. 2, 2025

(54) ELECTROCHEMICAL DEVICE, BATTERIES, METHOD FOR HARVESTING LIGHT AND STORING ELECTRICAL ENERGY, AND DETECTION METHODS

(71) Applicant: MAX-PLANCK-GESELLSCHAFT ZUR FÖRDERUNG DER WISSENSCHAFTEN E.V., Munich (DE)

(72) Inventors: Bettina Valeska Lotsch, Pähl (DE); Filip M. Podjaski, Stuttgart (DE); Julia Kröger, Stuttgart (DE); Hendrik Schlomberg, Munich (DE); Andreas Gouder, Stuttgart (DE)

(73) Assignee: MAX-PLANCK-GESELLSCHAFT ZUR FÖRDERUNG DER WISSENSCHAFTEN E.V., Munich (DE)

( * ) Notice: Subject to any disclaimer, the term of this patent is extended or adjusted under 35 U.S.C. 154(b) by 659 days.

(21) Appl. No.: 17/421,648

(22) PCT Filed: Jan. 9, 2019

(86) PCT No.: PCT/EP2019/050448
§ 371 (c)(1),
(2) Date: Jul. 8, 2021

(87) PCT Pub. No.: WO2020/143912
PCT Pub. Date: Jul. 16, 2020

(65) Prior Publication Data
US 2022/0093997 A1   Mar. 24, 2022

(51) Int. Cl.
*H01M 14/00* (2006.01)
*H01M 4/13* (2010.01)
*H01M 4/60* (2006.01)

(52) U.S. Cl.
CPC .......... *H01M 14/005* (2013.01); *H01M 4/13* (2013.01); *H01M 4/60* (2013.01)

(58) Field of Classification Search
CPC ......... H01M 14/005; H01M 4/13; H01M 4/60
See application file for complete search history.

(56) References Cited

U.S. PATENT DOCUMENTS

| | | | |
|---|---|---|---|
| 2011/0056841 A1* | 3/2011 | Wehrenberg | C25B 1/55 556/30 |
| 2015/0155418 A1 | 6/2015 | Hamada | |

(Continued)

FOREIGN PATENT DOCUMENTS

| | | |
|---|---|---|
| JP | H0498772 A | 3/1992 |
| JP | 2012053985 A | 3/2012 |
| WO | 2019/081036 A1 | 5/2019 |

OTHER PUBLICATIONS

Liu et al., "A solar rechargeable battery based on polymeric charge storage electrodes," *Electrochemistry Communications* 16(1): 69-72, 2012.

(Continued)

*Primary Examiner* — Stewart A Fraser
(74) *Attorney, Agent, or Firm* — Seed IP Law Group LLP

(57) ABSTRACT

The present invention relates to an electrochemical device, comprising a negative electrode comprising a nitrogen-containing electron storage material, a positive electrode, and an electrolyte, wherein the nitrogen-containing electron storage material has a two-dimensional or a three-dimensional covalent structure, contains heptazine and/or triazine moieties, and is capable of intercalating and de-intercalating cations. The present invention is further directed to a uses the material, a photorechargeable battery, an autophotorechargeable battery, a redox-flow-battery, a method for harvesting light and storing electrical energy, a method for (Continued)

detecting and removing oxygen, and a method for detecting light.

15 Claims, 18 Drawing Sheets

(56) References Cited

U.S. PATENT DOCUMENTS

| | | | | |
|---|---|---|---|---|
| 2016/0240851 | A1* | 8/2016 | Zhang | H01M 4/58 |
| 2017/0288158 | A1* | 10/2017 | Pillow | H10K 30/88 |
| 2019/0067497 | A1* | 2/2019 | Thomas | H01L 31/053 |
| 2019/0103607 | A1* | 4/2019 | Omichi | H01M 4/08 |

OTHER PUBLICATIONS

Liu et al., "A Solar Rechargeable Flow Battery Based on Photoregeneration of Two Soluble Redox Couples," *ChemSusChem* 6(5): 802-806, 2013.

Podjaski et al., "Toward an Aqueous Solar Battery: Direct Electrochemical Storage of Solar Energy in Carbon Nitrides," *Advanced Materials* 30(9): 1705477, 2018 (9 pages).

Yu et al., "Aqueous Lithium-Iodine Solar Flow Battery for the Simultaneous Conversion and Storage of Solar Energy," *Journal of the American Chemical Society* 137(26): 8332-8335, 2015.

\* cited by examiner

ELECTROCHEMICAL DEVICE, BATTERIES, METHOD FOR HARVESTING LIGHT AND STORING ELECTRICAL ENERGY, AND DETECTION METHODS

TECHNICAL FIELD

The present invention is directed towards an electrochemical device with a negative electrode comprising a nitrogen-containing electron storage material, uses thereof, a photorechargeable battery, an autophotorechargeable battery, a redox-flow-battery, a method for harvesting light and storing electrical energy, a method for detecting and removing oxygen, and a method for detecting light.

STATE OF THE ART

In view of the growing energy demand, there is an increasing need for more efficient and environmentally friendly, earth abundant energy storage systems. Batteries suffer from low power densities that pose problems to their versatility, especially regarding their use in of mobile applications. It is thus a primary goal of research in the field of battery technology to develop batteries having an improved power density. The problem of low power densities with regard to the use of mobile applications can also be overcome by the development of photorechargeable batteries, which can be charged by sunlight, thereby using renewable energy for establishing independence from the traditional electrical infrastructure. At the same time, it is a goal to find new energy storage materials consisting of earth-abundant elements, thereby allowing large scale production of low-cost batteries.

H. Tributsch, *Applied Physics* 1980, 23, 61-71, discusses the concept of photo intercalation and its possible application in solar energy devices. More particularly, these publications describe the potential use of $ZrSe_2$ and other metal salts for converting and simultaneously storing solar energy by means of light driven electrochemical reactions producing intercalation compounds of layer-type semiconducting material. G. Betz and H. Tributsch, *Progress in Solid State Chemistry* 1985, 16, 195-290, lists further metal salts as potential materials for such use.

US 2018/0175463 A1 relates to the field of alkaline batteries and especially to lithium batteries. A transparent electrochemical device is described, which combines the two technologies of a photovoltaic cell and a capacitor. In this device, an n-type semiconductor capable of intercalating and deintercalating alkali metal ions is used as the positive-electrode active material. The negative electrode comprises an element chosen from an alkali metal, an alloy of said alkali metal, and an intermetallic compound of said alkali metal. The device further contains a non-aqueous liquid electrolyte comprising a salt of said alkali metal and an organic solvent.

U.S. Pat. No. 8,865,998 B1 is directed to a photovoltaic electrochromic device, which combines a solar cell with an electrochromic device, and a method of manufacturing the same. According to the method, a thin-film solar cell is formed on a transparent substrate, wherein the thin-film solar cell includes an anode, a photoelectric conversion layer, and a cathode, and a portion of a surface of the anode is exposed from the thin film solar cell. An electrochromic thin film is then deposited on the cathode and the exposed surface of the anode. Thereafter, an electrolyte layer is formed on a surface of the thin-film solar cell to cover the electrochromic thin film. The anode and the cathode of the thin-film solar cell also serve as the anode and the cathode of the photovoltaic electrochromic device.

Y. Arora et al., *Scientific Reports* 2018, 8, Article No. 12752, describe a solar battery. In this work, solar energy capture and storage are coupled using a single bi-functional material. The electroactive semiconductors $BiVO_4$ (n-type) and $Co_3O_4$ (p-type) have been separately evaluated for their energy storage capability in the presence and absence of visible radiation. Each of these materials is described to function as a light harvester and to have faradaic capability. The authors describe an enhancement of ca. 30% of the discharge capacity of $BiVO_4$ in the presence of light.

S. N. Lou et al., *Advanced Energy Materials* 2017, 7, 1700545 relates to a solar-intercalation battery, which is able to both harvest and store solar energy within an electrode. More particularly, the authors describe a solar-rechargeable sodium-ion intercalation battery derived from a stand-alone $MoO_3$ photoanode that possesses the dual functionalities of solar energy harvesting and energy storage. $MoO_3$ is found to transform, via a two-phase reaction mechanism, initially into a sodium bronze phase, $Na_{0.33}MoO_3$, followed by the formation of solid solutions, $Na_xMoO_3$ ($0.33<x<1.1$), on further photointercalation.

The above-cited prior art documents are related to materials containing toxic elements, such as transition metals, or and thus expensive, rare elements. In order to allow large scale production of low-cost batteries and for facilitating recycling of such batteries, electron storage materials consisting mainly of non-toxic, earth-abundant elements such as carbon, hydrogen, and nitrogen, are particularly desirable. The use of carbon nitride materials in energy storage is controversial.

On the one hand, Y. Gong, et al., *ChemSusChem.* 2015, 8, 931-946 describe the potential use of functionalized $g-C_3N_4$. In this work, it is described that the poor conductivity of $g-C_3N_4$ is a main stumbling block for its use as an electrode material for lithium-ion batteries. The use of $g-C_3N_4$ graphite oxide hybrid material is described to be more promising. T. S. Miller et al., *Phys.Chem.Chem.Phys.* 2017, 19, 15613 discuss the significant irreversible capacity loss of carbon nitrides and concludes from the large semi-conducting band gap and bonding structure of carbon nitrides that these materials are likely unsuitable for use as energy storage materials.

On the other hand, A. Belen Jorge et al., *International Journal of Nanotechnology* 2014, 11, 737-746 is directed to the use of layered/graphitic carbon nitride as alternative anode material for Lithium-ion batteries. In this work, cyclic voltammetry is reported to show oxidation/reduction cycles in the 0.5-1.5 V range indicating that $Li^+$ intercalation took place.

G. M. Veith et al., *Chemistry of Materials* 2013, 25, 503-508 is directed to a lithiated graphitic carbon nitride ($C_3N_4$) fabricated by electrochemical and solid-state reactions. However, the addition of Li to $C_3N_4$ results in an irreversible reaction between the Li and the graphite-like $C_3N$ species in $C_3N_4$. This irreversible reaction leads to the formation of species, which are detrimental to anode properties.

J. Lv, et al., *Angewandte Chemie* 2018, 130, 12898-12902, describe a covalent organic framework integrating naphthalenediimide and triphenylamine units (NT-COF) and its use as cathode material in a Li-ion battery, which can undergo photo-assisted charging and de-charging. The NT-COF consists of two-dimensional porous nanosheets. The authors describe a synergetic effect between the reversible electrochemical reaction and intramolecular charge transfer with enhanced solar energy efficiency and accelerated electrochemical reaction. Charging the battery by solar energy alone without applying a voltage is not reported, i.e. no synergistic effect (autophotorechargeable) is observed. Y. Lui et al., *Energy & Environmental Science,* 2015, 8, 2664-2667, described the assisted photocharging of a Lithium-air battery with a carbon nitride. The effect is the same as in J. Lv, et al. By illumination, the charging voltage is reduced. Since the material provides a photovoltage (0.5V), which is not enough to drive the intercalation, an external voltage needs to be applied.

V. W.-h. Lau et al., *Angewandte Chemie International Edition* 2017, 56, 510-514, describe a cyanamide-functionalized heptazine-based polymer which, under solar irradiation, forms highly stable radicals in the presence of an electron donor, with lifetimes exceeding the diurnal cycle. The system thus stores sunlight as long-lived radicals. In this work, it has also been shown that the long-lived radicals can be formed by illumination in the presence of an electron donor. Applying a potential leads to the same color change effects as observed for the stable radical ion.

In view of the above, to the best of the inventors' knowledge, electron storage materials, which combine light harvesting and electrical energy storage, which can be reversibly charged, and which consist of earth-abundant elements, are not known from the general scientific and patent literature. In particular, anode materials made of earth-abundant elements, which can be charged by irradiation without applying a potential and which have an improved electron storage capacity due to reversible photo intercalation of cations are not described in the general prior art.

It is thus an object of the present invention to provide electron storage materials consisting of earth-abundant elements, having an improved electron storage capacity, and being reversibly chargeable by solar energy.

Some of the present inventors describe in Podjaski et al., *Advanced Materials* 2018, 1705477, two-dimensional cyanamide-functionalized polyheptazine imide, which enables the synergistic coupling of light harvesting and electron storage/electrical energy storage, in a single material. More particularly, Podjaski et al. describe a solar battery half-cell comprising nanoparticles of two-dimensional cyanamide-functionalized polyheptazine imide deposited on conductive fluorine-doped tin oxide. This half-cell enables the absorption of light, the storage of photo-induced electrons and their release in the form of electrical energy.

While this document describes a photorechargeable half-cell, it does not describe a full battery. More particularly, the positive electrode moiety is not investigated. Hence, the storage and transportation of the positive charge, i.e. the holes, has not been addressed. Thus, this document does not provide a full battery solution using the negative electrode half-cell described therein.

In view of this document, the present invention aims at the provision of a full battery comprising a nitrogen-containing electron storage material with a two- or three-dimensional covalent structure and having an improved capacity, an increased lifetime, and increased cycle life. For this purpose, materials suitable for hole transport and/or hole storage in connection with this electron storage material have to be identified and arranged, in order to provide an efficient full battery. The invention is further directed to method and uses involving such battery.

SUMMARY OF THE INVENTION

The invention is defined by the following aspects.

In a first aspect, the present invention aims at providing an electrochemical device, comprising
a negative electrode comprising a nitrogen-containing electron storage material,
a positive electrode, and
an electrolyte,
wherein the nitrogen-containing electron storage material has a two-dimensional or a three-dimensional covalent structure, contains heptazine and/or triazine moieties, and is capable of intercalating and de-intercalating cations.

The first aspect of the present invention is illustrated by FIGS. 1 to 3.

This material is capable of storing electrons or holes, and preferably electrons. The term "electrical energy storage" within the meaning of the present invention refers to the storage of electrons or holes, and preferably electrons.

In a second aspect, the invention is directed to a photorechargeable battery comprising
a negative electrode comprising a substrate with a surface and a layer comprising a nitrogen-containing electron storage material provided on the surface of the substrate, and
a positive electrode comprising a substrate with a surface and
a layer comprising a hole storage material provided on the surface of the substrate, and
a photovoltaic element sandwiched between the layer of the nitrogen-containing electron storage material and the layer of the hole storage material,
wherein the photovoltaic element is capable of charging the electrodes upon illumination, and wherein the nitrogen-containing electron storage material has a two-dimensional or a three-dimensional covalent structure, contains heptazine and/or triazine moieties, and is capable of intercalating and de-intercalating cations.

Preferred embodiments of the photorechargeable battery are illustrated by FIGS. 4 and 5.

A third aspect of the present invention relates to an autophotorechargeable battery, comprising
a negative electrode comprising a substrate with a surface and
a layer comprising a nitrogen-containing electron storage material provided on the surface of the substrate,
a positive electrode comprising a substrate with a surface, and a layer comprising a hole storage material provided on the surface of the substrate, and
an electrolyte,
wherein the nitrogen-containing electron storage material has a two-dimensional or a three-dimensional covalent structure, is capable of intercalating and de-intercalating cations, and has a band gap in the range of 0.5 to 3.5 eV.

Preferred embodiments of the autophotorechargeable battery according to the third aspect are illustrated by FIGS. 6 and 7.

According to the fourth aspect, the present invention is directed to an autophotorechargeable battery comprising
a negative electrode comprising a substrate with a surface and
a layer comprising an electron storage material provided on the surface of the substrate,
a positive electrode comprising a substrate with a surface, and a layer comprising a nitrogen-containing hole storage material provided on the surface of the substrate, and an electrolyte, wherein the nitrogen-containing hole storage material has a two-dimensional or a three-dimensional covalent structure, is capable of intercalating and de-intercalating cations and/or anions, and has a band gap in the range of 0.5 to 3.5 eV.

In a fifth aspect, the invention relates to a redox flow battery comprising an electrochemical cell comprising the electrochemical device according to the first aspect of the present invention, the photorechargeable battery according to the second aspect of the present invention, or the autophotorechargeable battery according to the third or fourth aspect of the present invention, one or more tanks containing an electrolyte solution, pipes connecting each of the tanks to the electrochemical cell, and a pump for circulating each of the electrolyte solutions between the electrochemical cell and the respective tank.

Preferred embodiments of the redox flow battery are illustrated by FIG. 8.

According to the sixth aspect, the invention relates to a method for harvesting light and storing electrical energy, the method including the steps of, providing an electrochemical device comprising a negative electrode comprising a substrate with a surface and a layer comprising a nitrogen-containing electron storage material provided on the surface of the substrate, and illuminating the nitrogen-containing electron storage material with sunlight, wherein the nitrogen-containing electron storage material has a two-dimensional or a three-dimensional covalent structure and is capable of intercalating and de-intercalating cations, and wherein light harvesting occurs within the nitrogen-containing electron storage material during the step of illuminating the nitrogen-containing electron storage material and electron storage occurs within the nitrogen-containing electron storage material during and after the step of illuminating the electron storage material.

Preferred embodiments of the method are illustrated by FIG. 9.

The seventh aspect of the present invention relates to a method for harvesting light and storing electrical energy, the method including the steps of, providing an electrochemical device comprising a positive electrode comprising a substrate with a surface and a layer comprising a nitrogen-containing hole storage material provided on the surface of the substrate, and illuminating the nitrogen-containing hole storage material with sunlight, wherein the nitrogen-containing hole storage material has a two-dimensional or a three-dimensional covalent structure and is capable of intercalating and de-intercalating cations and/or anions, and wherein light harvesting and hole storage occurs within the nitrogen-containing hole storage material during the step of illuminating the nitrogen-containing hole storage material.

In an eighth aspect, the present invention is directed to a method for detecting or removing oxygen, the method including the steps of, providing an electrochemical device according to the first aspect of the present invention, charging the nitrogen-containing electron storage material with electrons, bringing the nitrogen-containing electron storage material in the charged state in contact with a test fluid or gas, and analyzing the state of the layer of the nitrogen-containing electron storage material by visual detection, e.g. by simple observation of a color change, or by measuring the change of the electrical potential of the device before, during and/or after bringing it in contact with the test fluid or gas.

A preferred embodiment of this method is illustrated in FIG. 10.

In the ninth aspect, the present invention is directed to a method for detecting light, the method including the steps of, providing an electrochemical device to the first aspect of the present invention, illuminating the layer of the nitrogen-containing electron storage material, detecting the state of the nitrogen-containing electron storage material by optical means or by measuring the electrical potential between the electrodes before, during and/or after illumination. This aspect is illustrated in FIG. 11.

In the last aspect, the invention also relates to various uses of the electrochemical device of the present invention in or as batteries and in or as detectors.

comprising a substrate (210) and a layer of a hole storage material (212) provided on the substrate, and an electrolyte (204).

Figure 1:
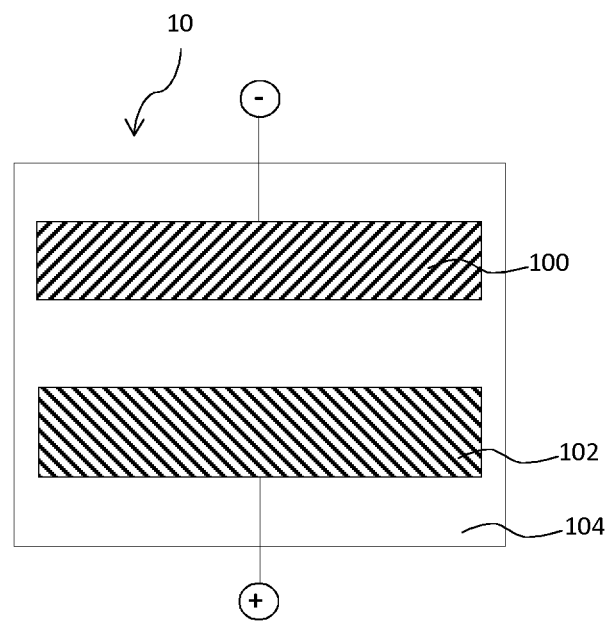
FIG. 1 is a schematic view of the electrochemical device according to the first aspect of the invention. The electrochemical device (10) comprises a negative electrode (100) comprising a nitrogen-containing electron storage material, a positive electrode (102), and an electrolyte (104).
Figure 2:
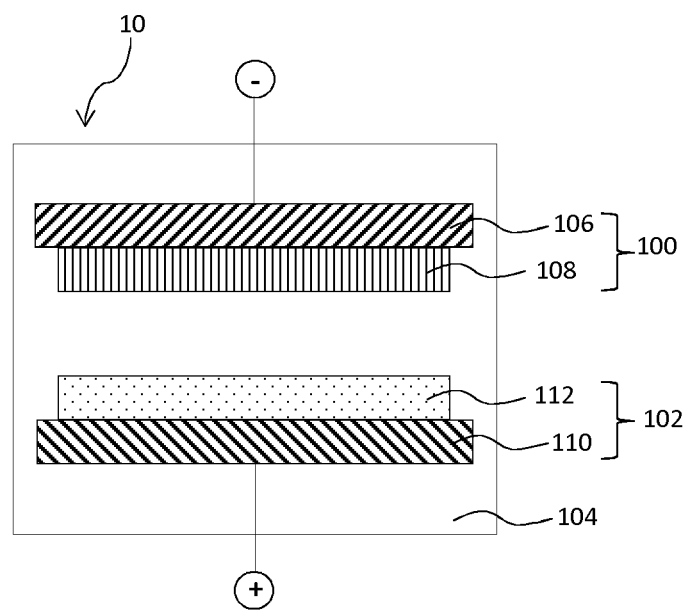
FIG. 2 is a schematic view of an embodiment of the electrochemical device according to the first aspect of the invention. The electrochemical device (10) according to this embodiment comprises a negative electrode (100) comprising a substrate (106) and a layer of the nitrogen-containing electron storage material (108) provided on the substrate (106), a positive electrode (102) comprising a substrate (110) and a layer of a hole storage material (112) provided on the substrate (110), and an electrolyte (104).
Figure 3:
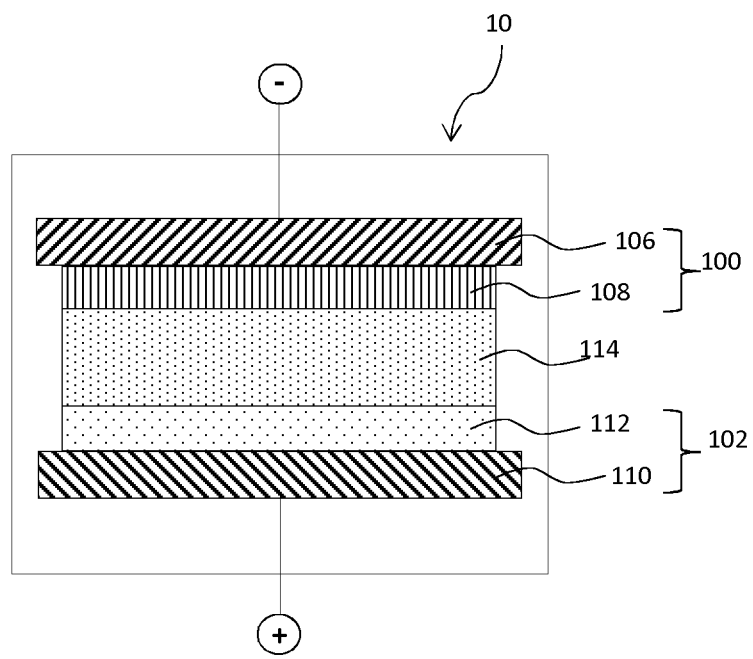
FIG. 3 is a schematic view of a further embodiment of the electrochemical device according to the first aspect of the invention. In this embodiment, a layer of a solid state electrolyte (114) is sandwiched between the layer of the nitrogen-containing electron storage material (108) and the layer of a hole storage material (112).
Figure 4:
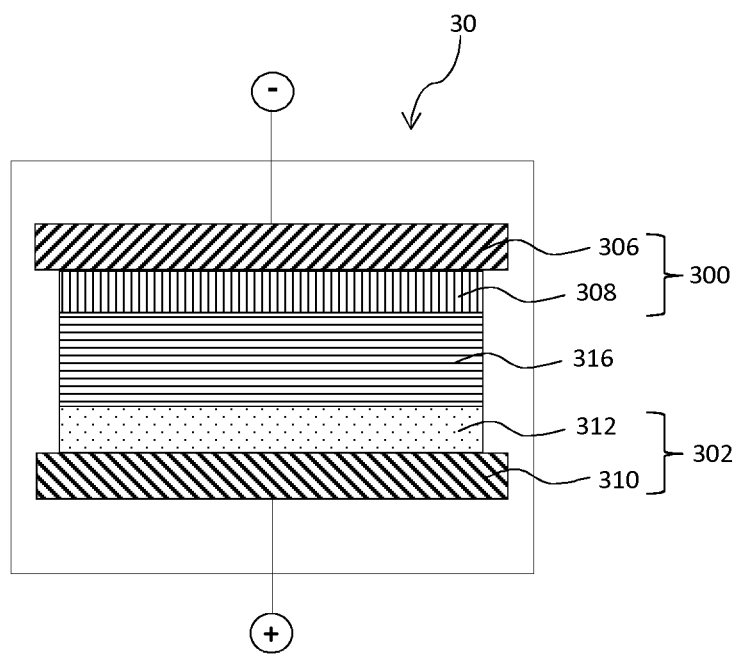
FIG. 4 is a schematic view of a photorechargeable battery according to the second aspect of the invention. The photorechargeable battery (30) comprises a negative electrode (300) comprising a substrate (306) with and a layer of a nitrogen-containing electron storage material (308) provided on the substrate (306), and a positive electrode (302) comprising a substrate (310) and a layer of a hole storage material (312) provided on the substrate (310), and a photovoltaic element (316) sandwiched between the layer of the nitrogen-containing electron storage material (308) and the layer of the hole storage material (312).
Figure 5:
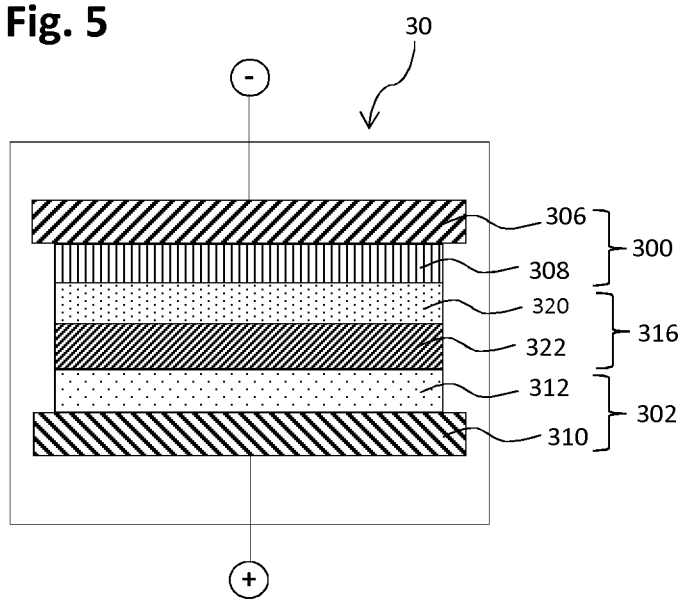
FIG. 5 is a schematic view of a further embodiment of the photorechargeable battery according to the second aspect of the invention. In this embodiment, the photovoltaic element (316) comprises a n-type semiconductor layer (320) and an p-type semiconductor layer (322).
Figure 6:
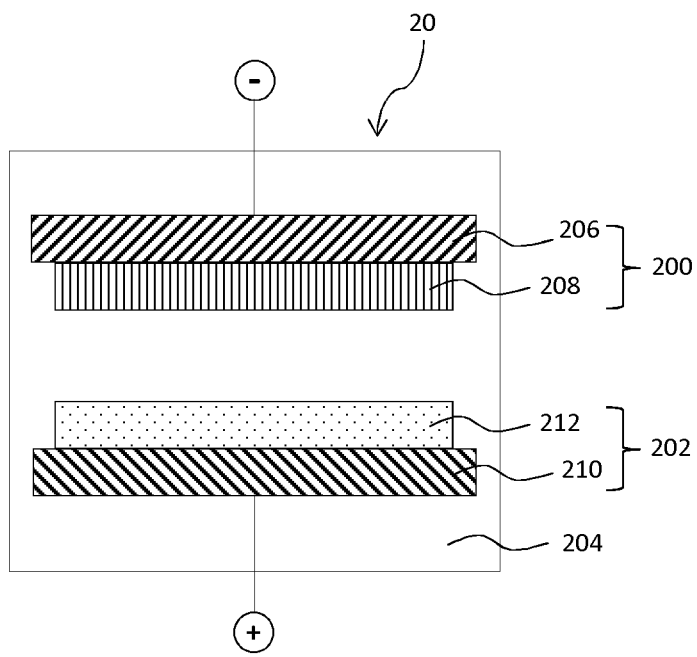
FIG. 6 is a schematic view of the autophotorechargeable battery according to the third aspect of the present invention. The autophotorechargeable battery (20) comprises a negative electrode (200) comprising a substrate (206) and a layer of a nitrogen-containing electron storage material (208) provided on the substrate (206), a positive electrode (202)
Figure 7:
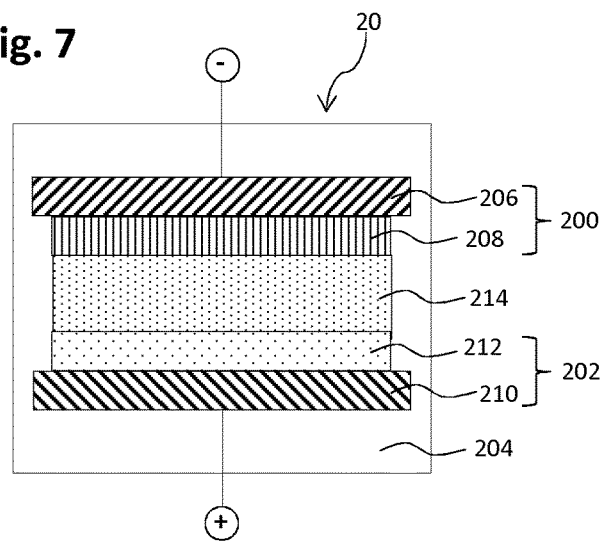

FIG. 7 is a schematic view of an embodiment of the autophotorechargeable battery according to the third aspect of the present invention, wherein a layer of a hole transport or electron blocking material (214) is sandwiched between the electron storage material (208) and the hole storage material (212).

Figure 8:
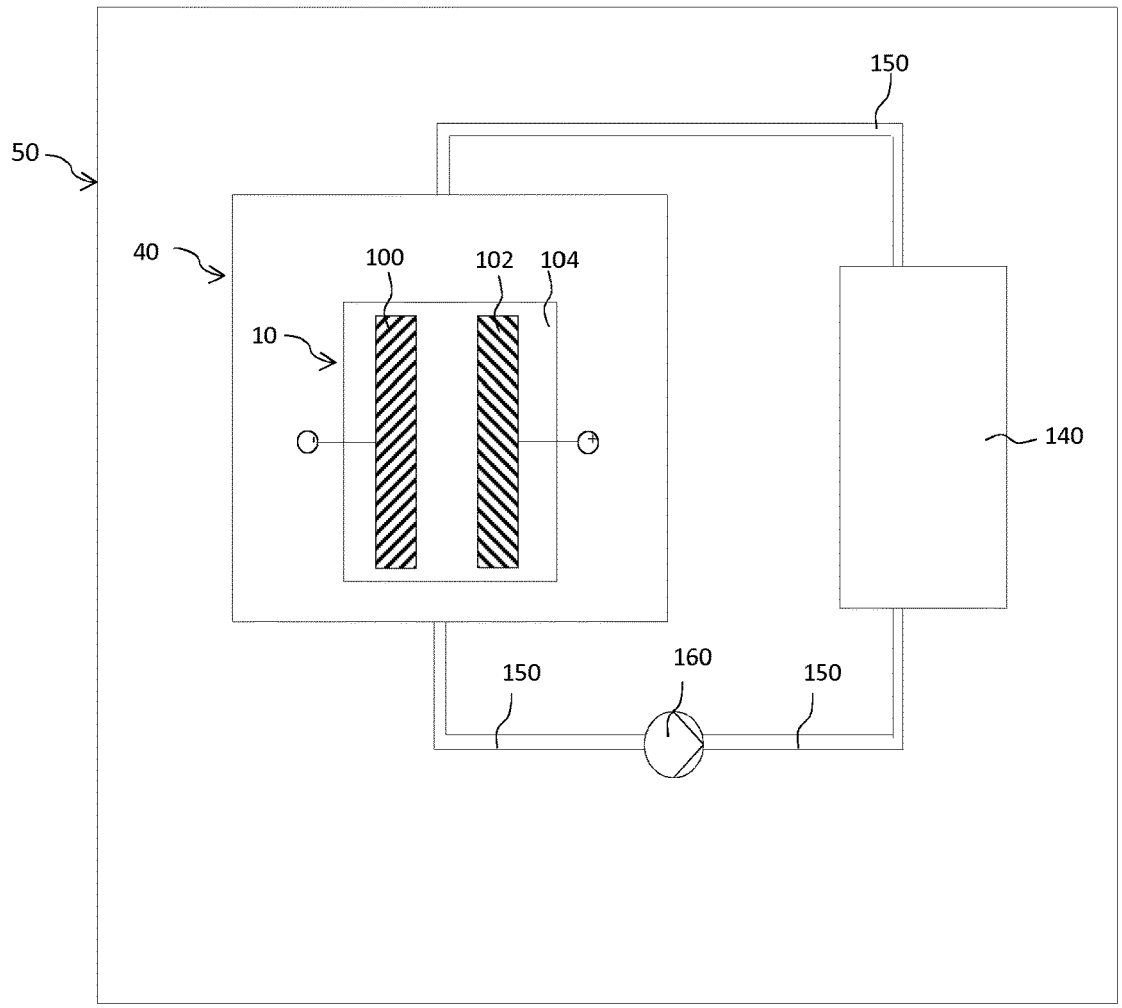

FIG. 8 is a schematic view of a redox flow battery according to the fifth aspect of the present invention. The redox flow battery (50) comprises an electrochemical cell (40) comprising an electrochemical device (10) according the first, third or fourth aspect of the present invention, a tank (140) containing an electrolyte solution, pipes (150) connecting the tank to the electrochemical cell (40), and a pump (160) for circulating the electrolyte solution between the electrochemical cell and the tank. Since the electrolyte is a charge storage medium, the positive contact for the electrical discharge of the device should ideally be placed in the storage tank (140). Hence, the positive electrode preferably comprises or is the tank. That is, the positive contact is preferably in contact with the electrolyte in the tank.

Figure 9:
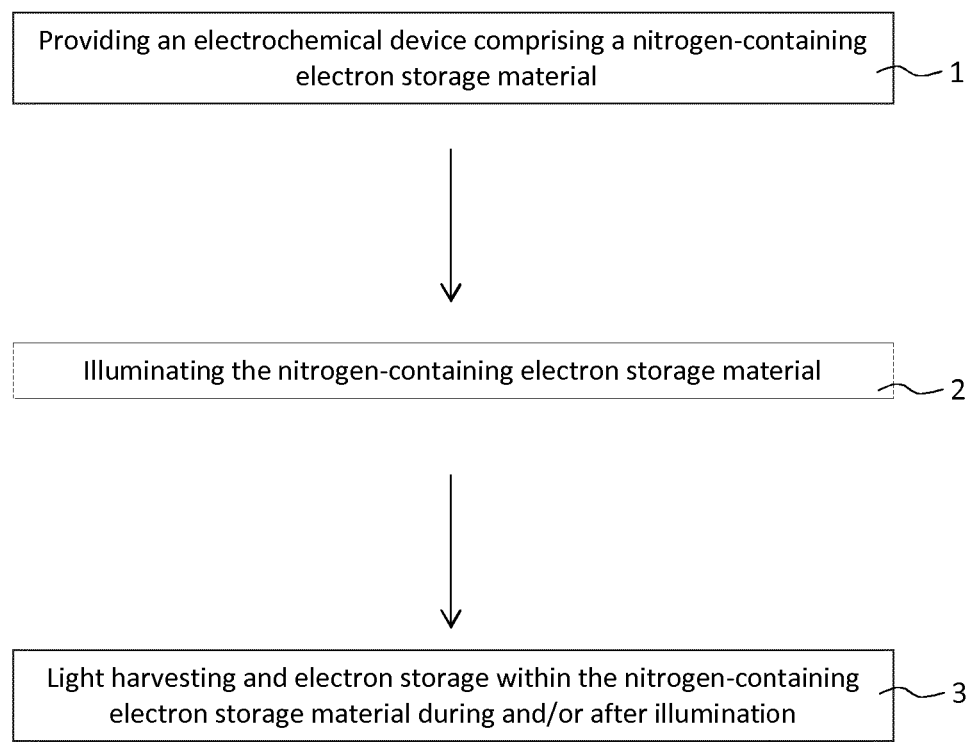

FIG. 9 is a flowchart showing the steps of the method for harvesting light and storing electrical energy according to the sixth aspect of the present invention and shows the steps of (1) providing an electrochemical device comprising a negative electrode comprising a substrate with a surface and a layer of a nitrogen-containing electron storage material provided on the surface of the substrate, (2) illuminating the nitrogen-containing electron storage material with sunlight, and indicates that (3) light harvesting occurs within the nitrogen-containing electron storage material during the step of illuminating the electron storage material, and electron storage occurs within the nitrogen-containing electron storage material during and after the step of illuminating the electron storage material.

Figure 10:
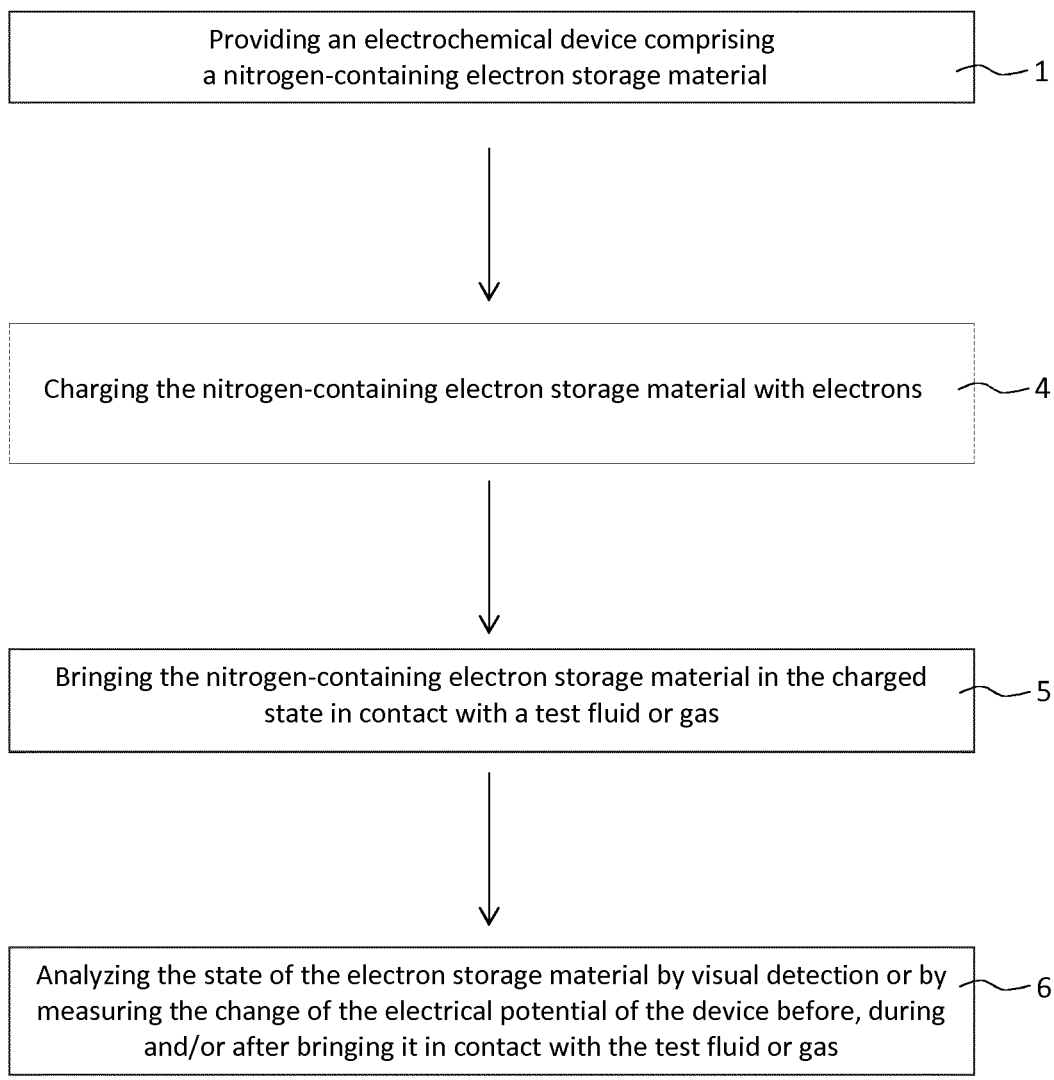

FIG. 10 is a flowchart showing the steps of the method for detecting or removing oxygen according to the eighth aspect of the present invention and shows the steps of (1) providing an electrochemical device according to the first aspect of the invention, (4) charging the electron storage material with electrons, (5) bringing the electron storage material in the charged state in contact with a test fluid or gas, and (6) analyzing the state of the layer of the electron storage material by visual detection or by measuring the change of the electrical potential during and/or after bringing it in contact with the test fluid or gas.

Figure 11:
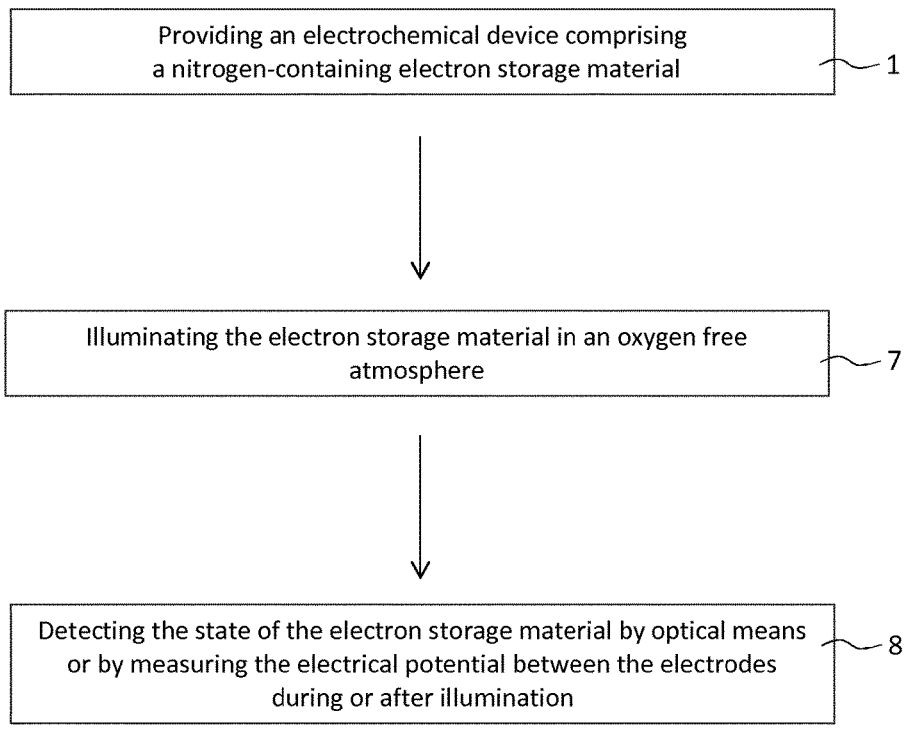

FIG. 11 is a flowchart showing the steps of the method for detecting light according to the ninth aspect of the present invention and shows the steps of (1) providing an electrochemical device according to the first aspect of the invention, (7) illuminating the nitrogen-containing electron storage material, and (8) detecting the state of the electron storage material by optical means or by measuring the electrical potential between the electrodes.

Figure 12:
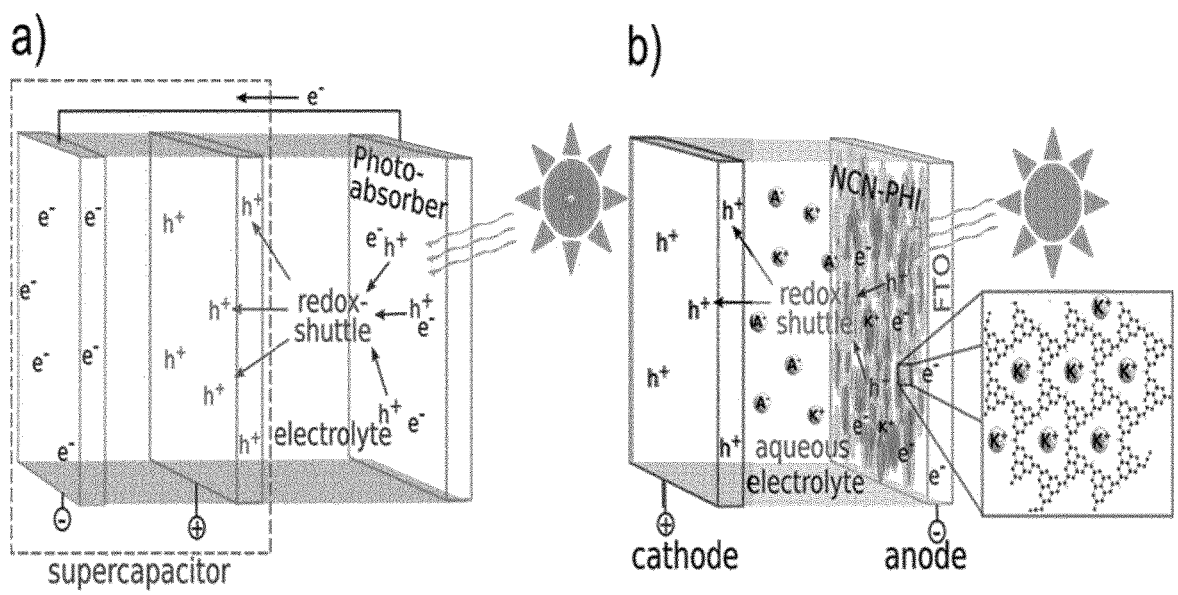

FIG. 12 a) illustrates the concept of a traditional solar battery or solar photo-capacitor. Photogenerated electrons and holes created in a photoabsorber are transported via an external circuit and a redox shuttle to an electrochemical storage device. FIG. 12 b) illustrates an autophotorechargeable battery based on NCN-PHI. Photoabsorption and electron storage occurs within the same material. Holes are extracted to a counter-electrode via the electrolyte by a redox shuttle (or charge selective contact).

Figure 13:
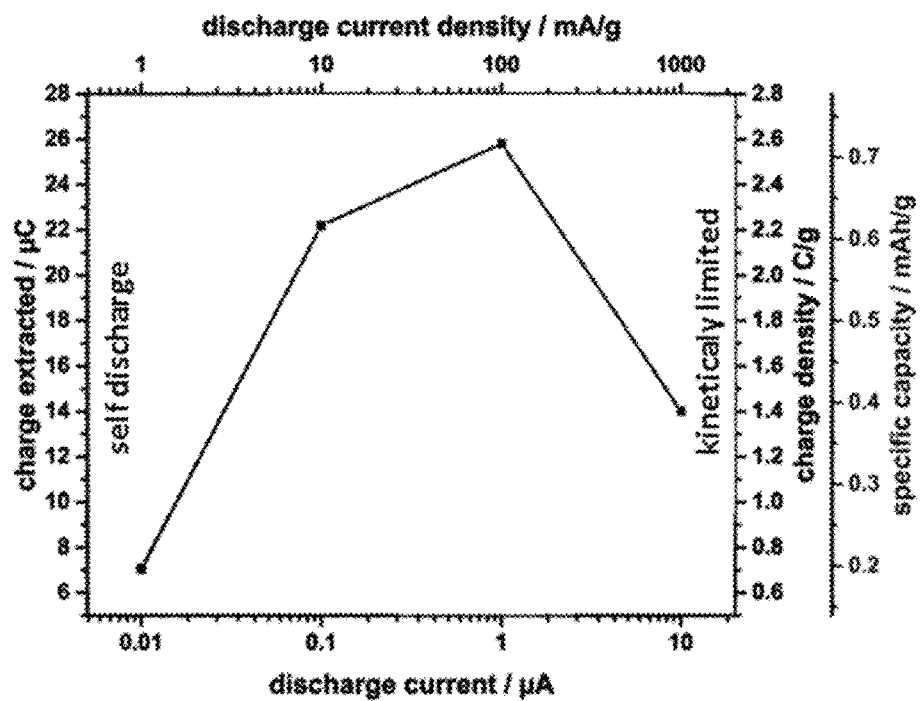
Figure 13:
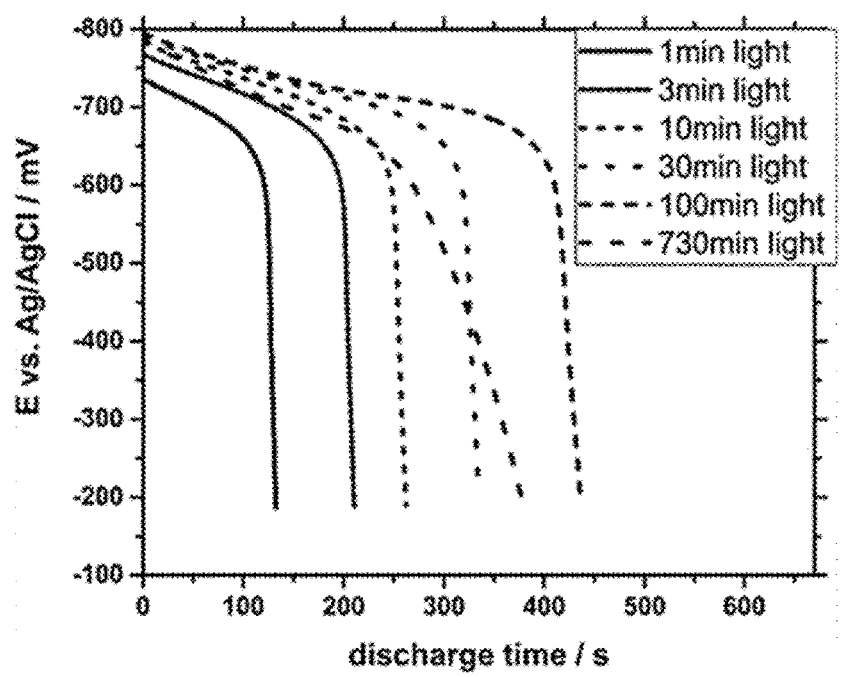
Figure 13:
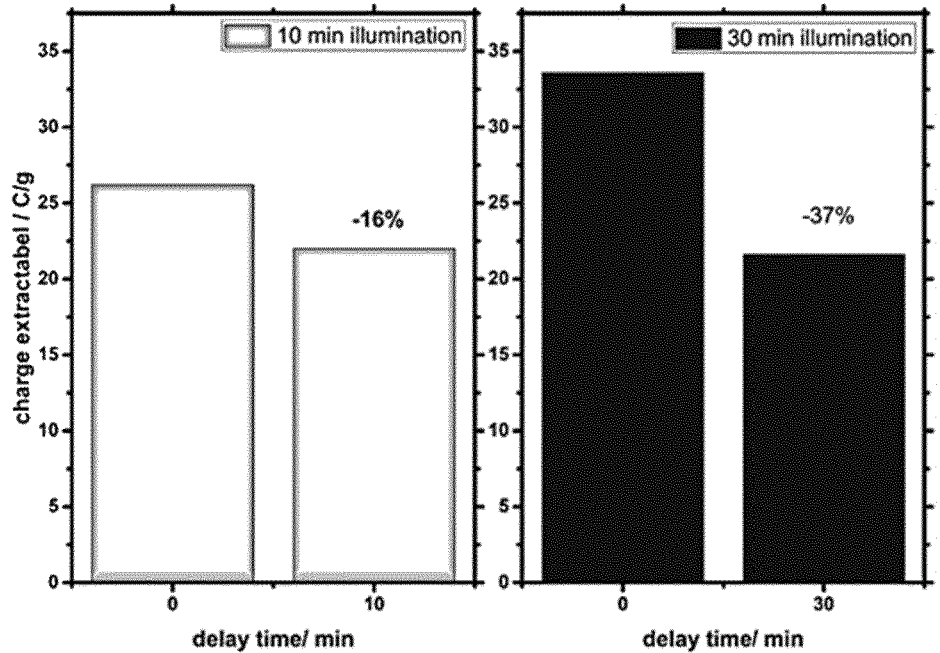
Figure 13:
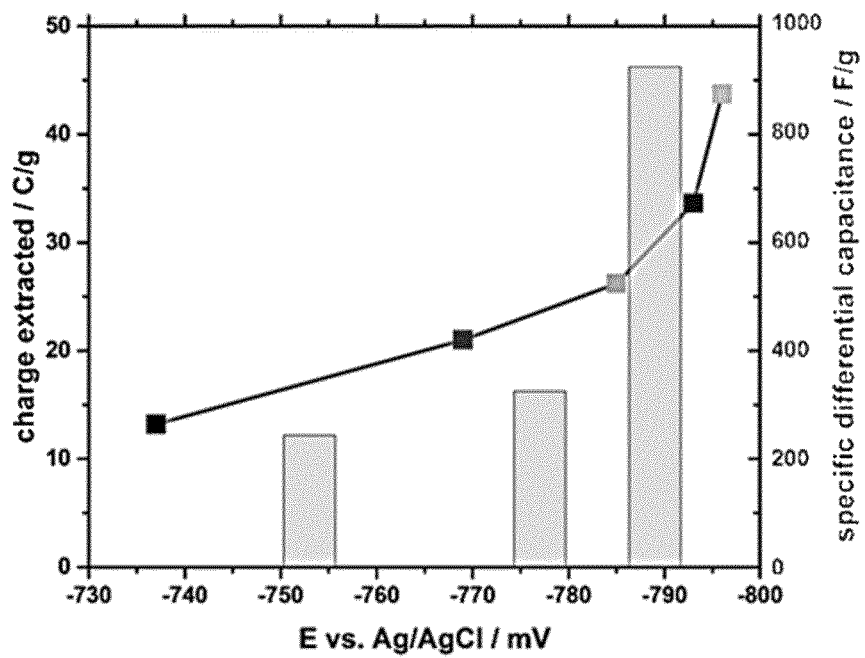

FIG. 13 shows the characteristics of an NCN-PHI solar battery half-cell (negative electrode comprising a nitrogen-containing electron storage material) and summarizes the discharge properties of electrodes with 10 μg NCN-PHI, phosphate buffer and 5 mM 4-MBA as electrolyte and electron donor, respectively. FIG. 13a) Evaluation of the total extracted charge after 1 min of illumination as a function of the discharge current densities varying from 1 mA/g to 1 A/g. FIG. 13b) Discharge profiles at 100 mA/g showing increased charge storage after increasing illumination times. FIG. 13c) Comparison of the extracted charge after 10 min illumination and direct (0 min) or 10 min delayed discharge (left) as well as 30 min illumination and direct and 30 min delayed discharge (right). FIG. 13d) Extracted charge from b) as a function of the corresponding electrode potential before the discharge and evaluation of the charge density (differential capacitance) resulting from the charge difference between the respectively attained voltage values (OCP).

Figure 14:
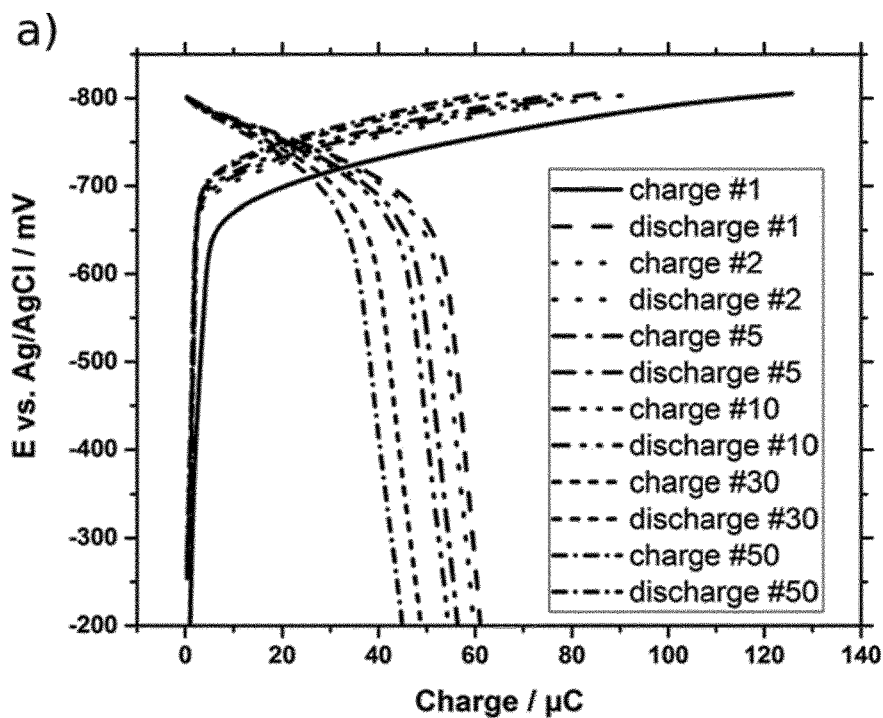
Figure 14:
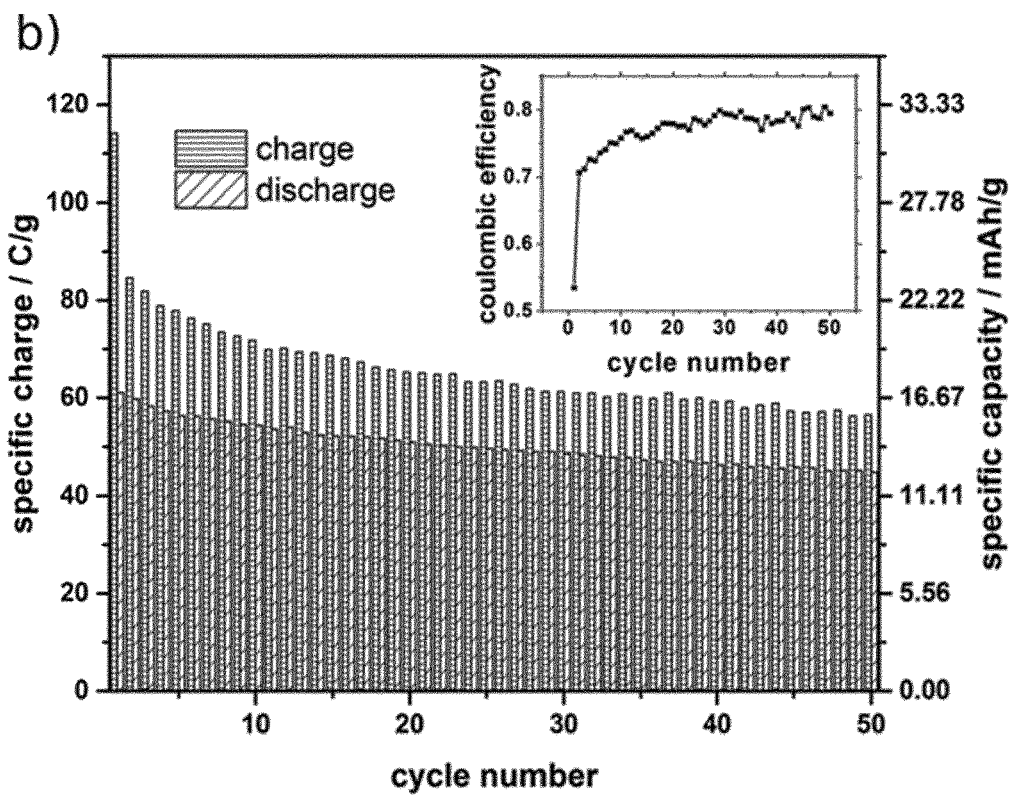

FIG. 14 shows the cyclic electrical charging and discharging profiles (50 cycles) with 100 mA/g between −200 and −800 mV vs. Ag/AgCl in phosphate buffer. a) Selected profiles of the 1st, 2nd, 5th, 10th, 30th and 50th charging and discharging cycle. The relatively slow voltage increase above −700 mV vs. Ag/AgCl underlines the increased capacitance in that region. b) Evolution of the charge stored and extracted during 50 cycles. While the overall charge stored and extracted decreases with increasing cycle number, the coulombic efficiency (inset) approaches a constant value of approx. 80%, indicating a good electronic stability.

Figure 15:
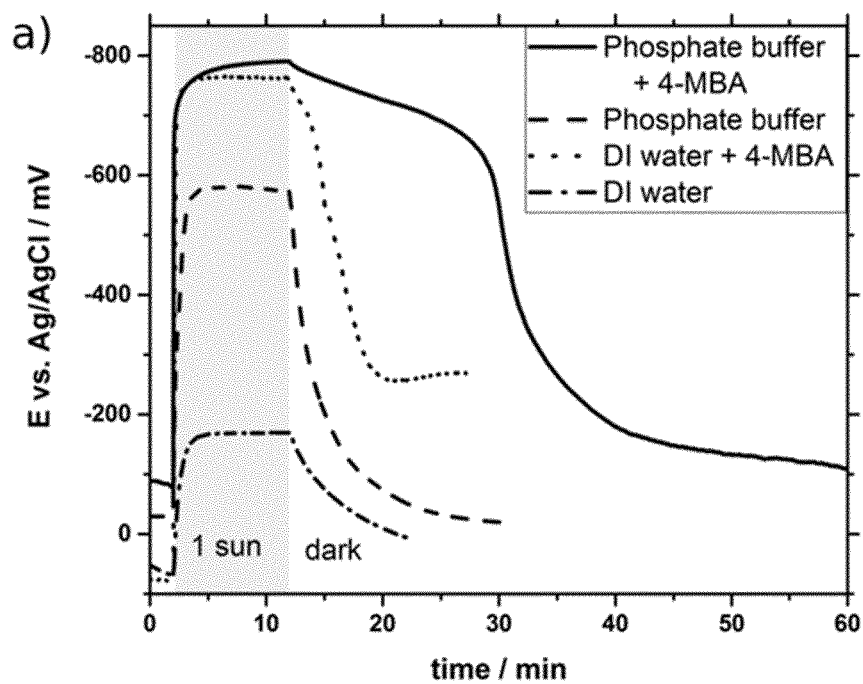
Figure 15:
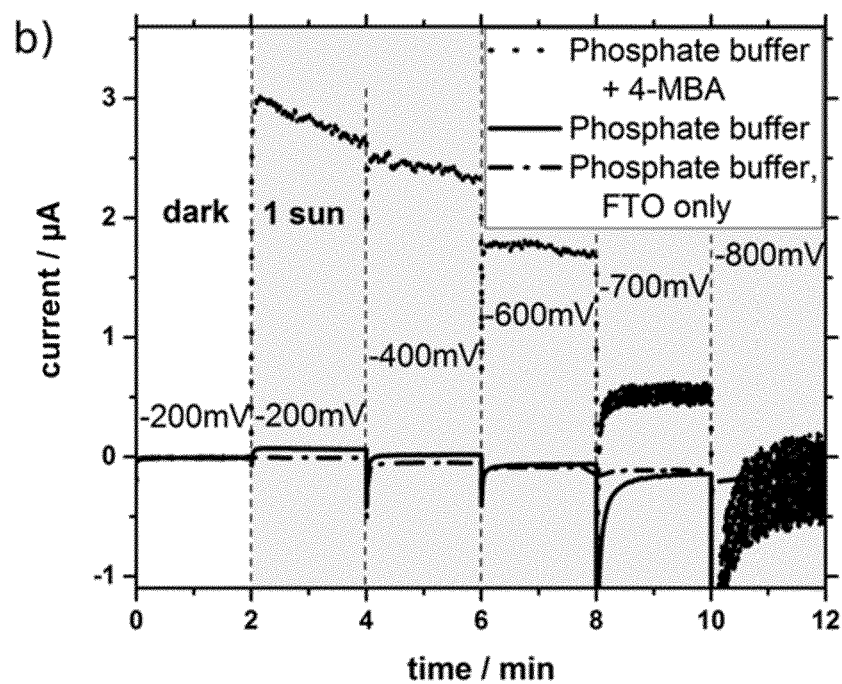
Figure 15:
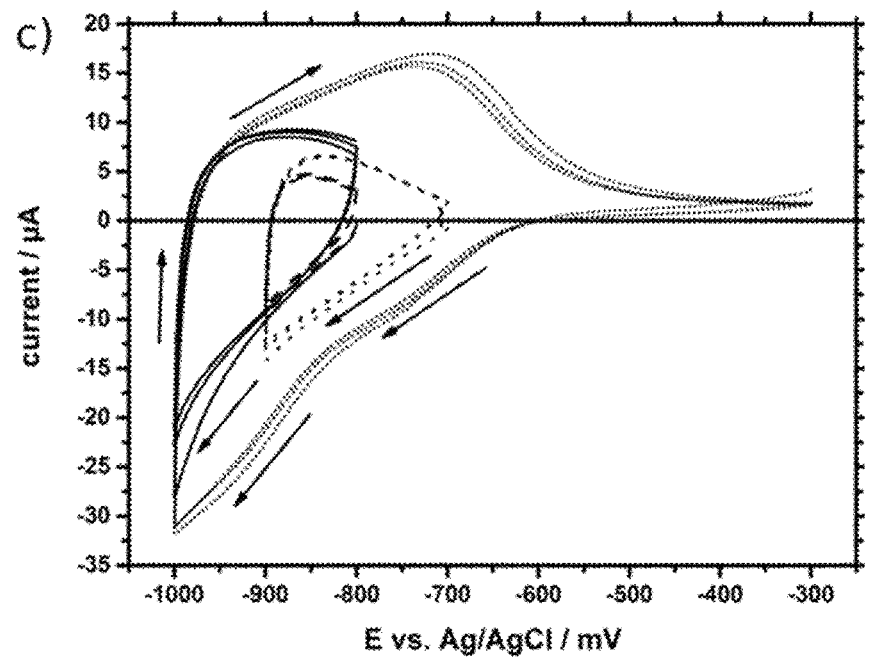
Figure 15:
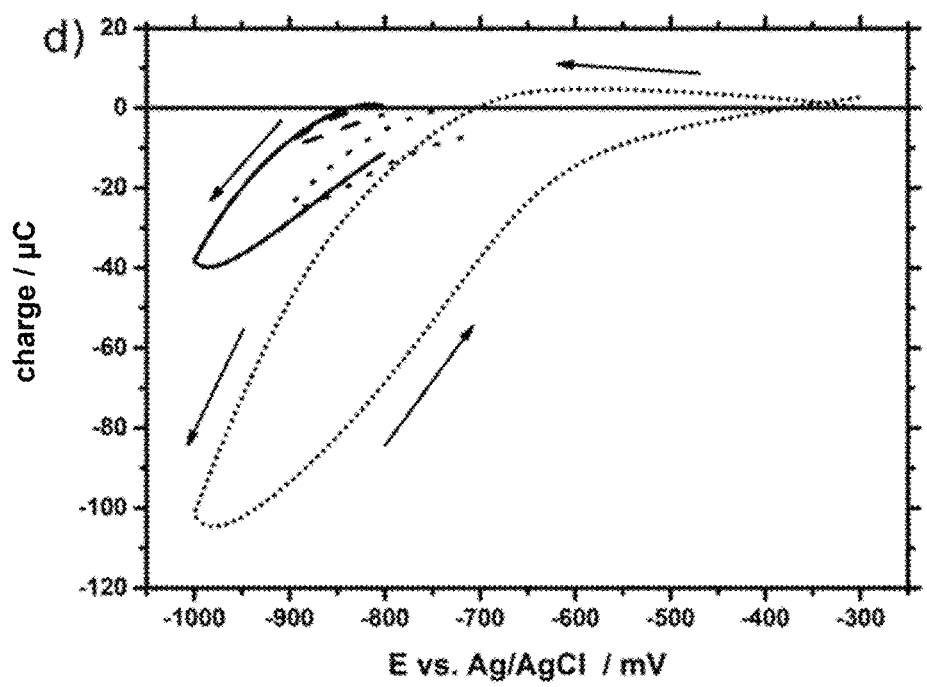

FIG. 15 shows (photo)electrochemical measurements on NCN-PHI electrodes. a) OCP measurements before, during and after 10 min of 1 sun illumination, showing the potential and the stability of stored photoelectrons depending on the electrolyte and donor. b) (Dis)charging currents at different potentials under illumination in the presence of a donor and without, providing a measure of electron generation and self-discharge currents under illumination. c) CV scans at 50 mV/s in the dark in 1 M KCl for different potential windows, highlighting the voltage-dependent charge storage ability of NCN-PHI electrodes. d) Charge stored in and withdrawn from the electrode during the respective scans in c).

Figure 16:
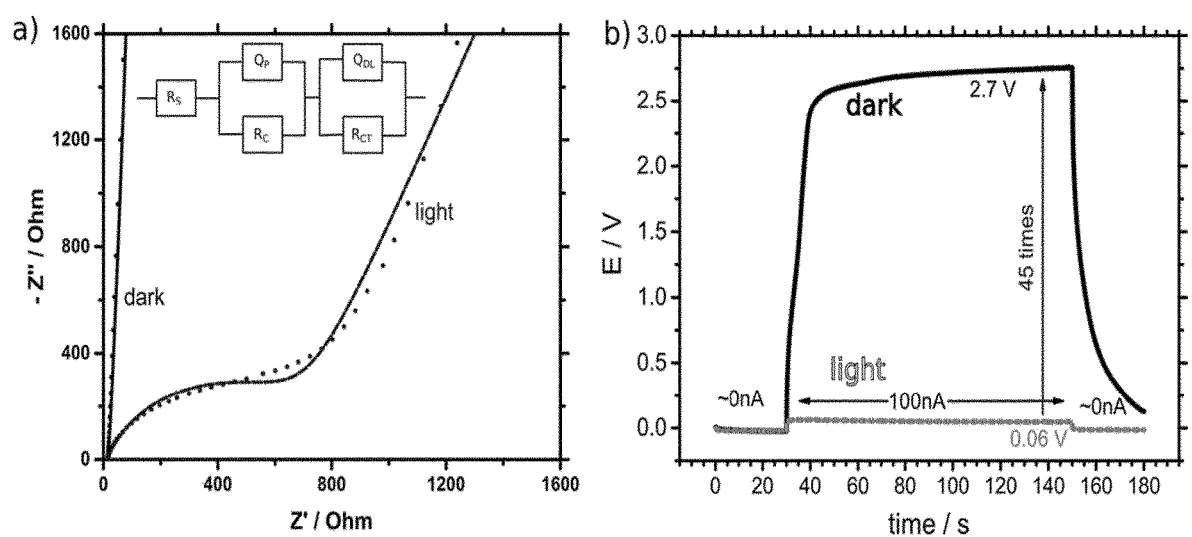

FIG. 16 illustrates the conductivity of NCN-PHI nanosheets on FTO. a) Impedance measurements in oxygen free 1 M KCl+5 mM 4-MBA in the yellow ground state and in the light induced, blue state which shows a significantly lower charge transfer resistance. Insets: equivalent circuit diagram used to fit the data. b) Galvanostatic two-point resistivity measurements on a FTO-NCN-PHI-FTO electrode sandwich measured in air. The voltage drop due to resistance of NCN-PHI in the dark is 45 times higher than in the illuminated case.

Figure 17:
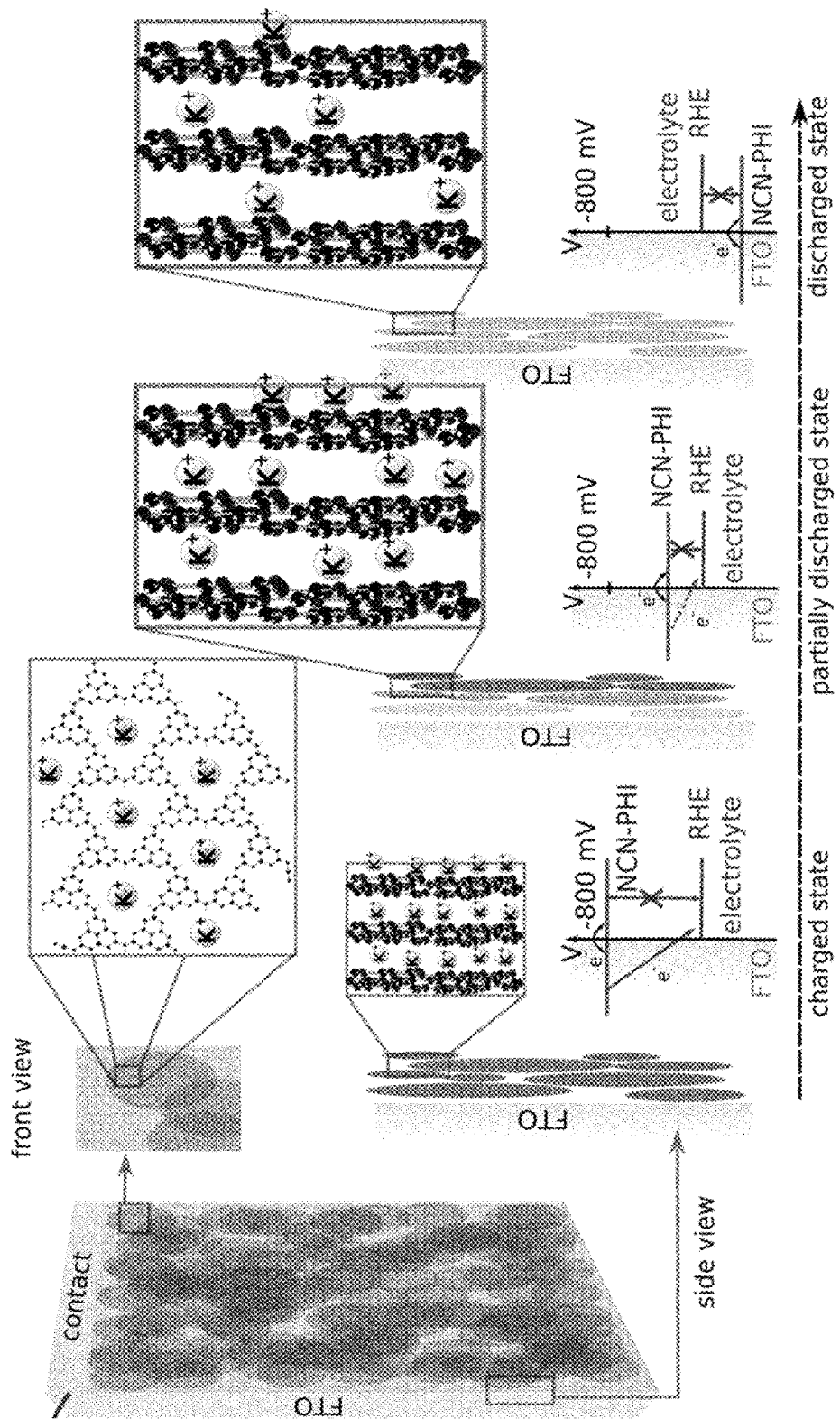

FIG. 17 is a schematic view of a layered NCN-PHI photoelectrode, illustrating the role of alkali metal cations from the solution that can access the pores and stabilize the electronic charge on the NCN-PHI, which can be described as a pseudocapacitive process. The effectiveness of charge stabilization is thus a diffusion-limited process which is significantly influenced by the structure (pore size and alignment) and morphology (surface area) of the carbon nitride. Since discharging starts from the inner parts of the NCN-PHI film which are in close contact to the substrate, the morphology-limited percolation of charge carriers affects the material's conductivity at high current densities. The evolution from a charged to a discharged state is illustrated in the bottom part, showing the potential measured at the FTO surface, possible charge transfer paths between FTO, NCN-PHI and the electrolyte, as well as the role of alkali metal ions from the electrolyte that enable pseudocapacitive screening of the trapped electrons.

Figure 18:
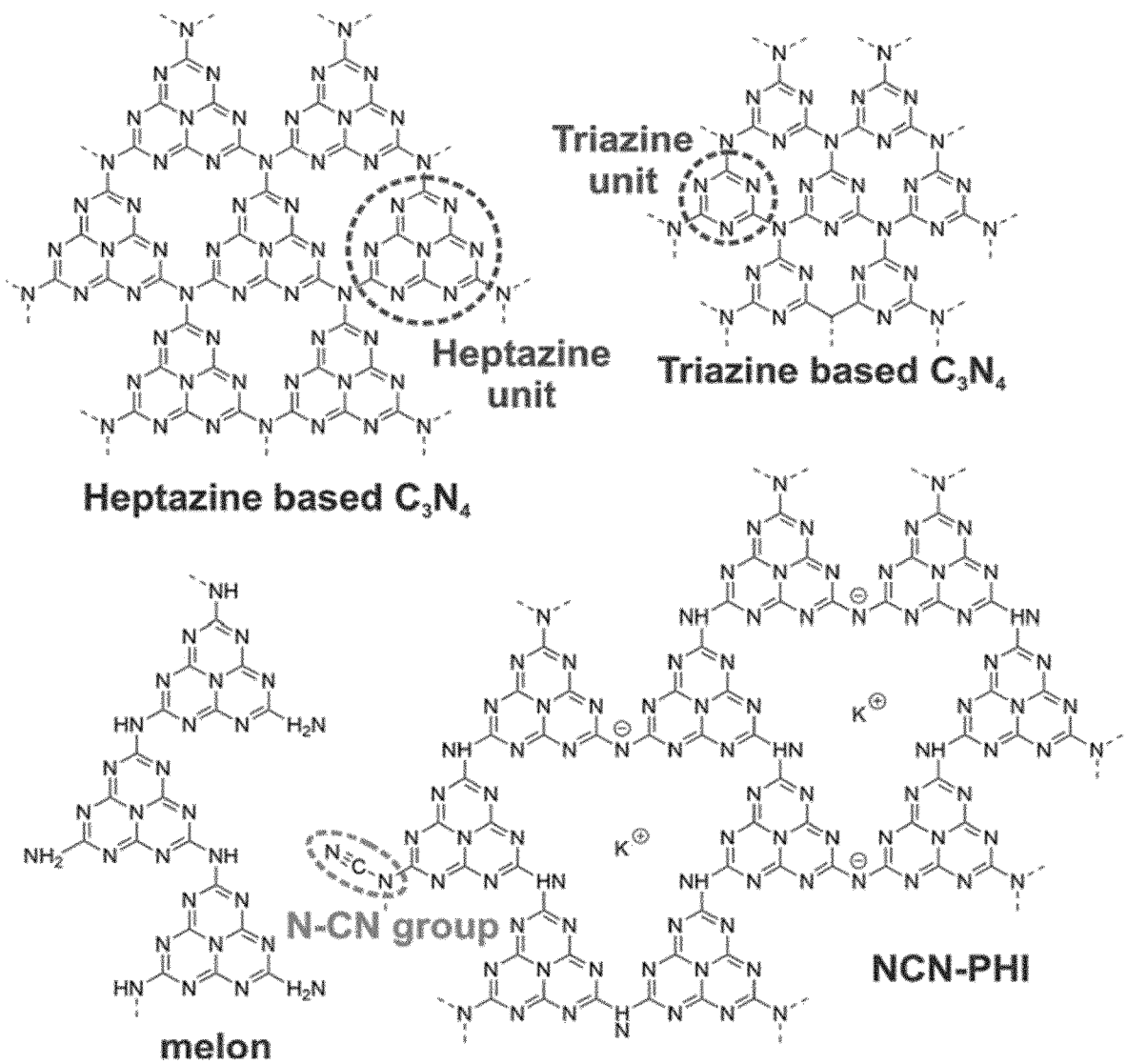

FIG. 18 displays structure of several different polymers containing heptazine and/or triazine moieties, such as melon and NCN-PHI. Dashed lines represent bonds, at which the respective structure is further extended. NCN-PHI may also be functionalized with CN group at these dashed lines, so as to form a NCN group, which is also shown by a dashed circle.

Figure 19:
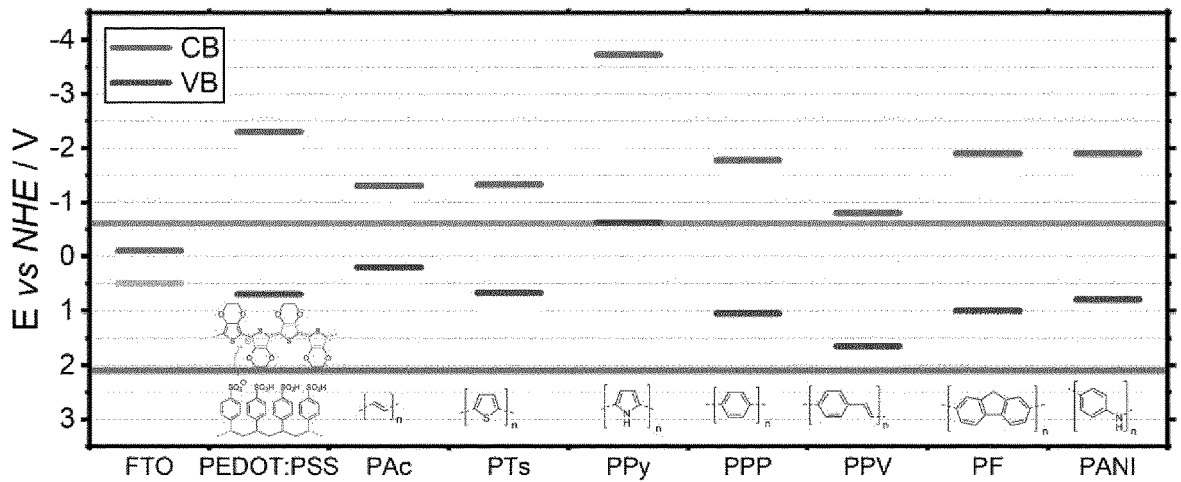

FIG. 19 shows conductive polymers and their band positions with respect to a normal hydrogen electrode (NHE) and compared to NCN-PHI.

Figure 20:
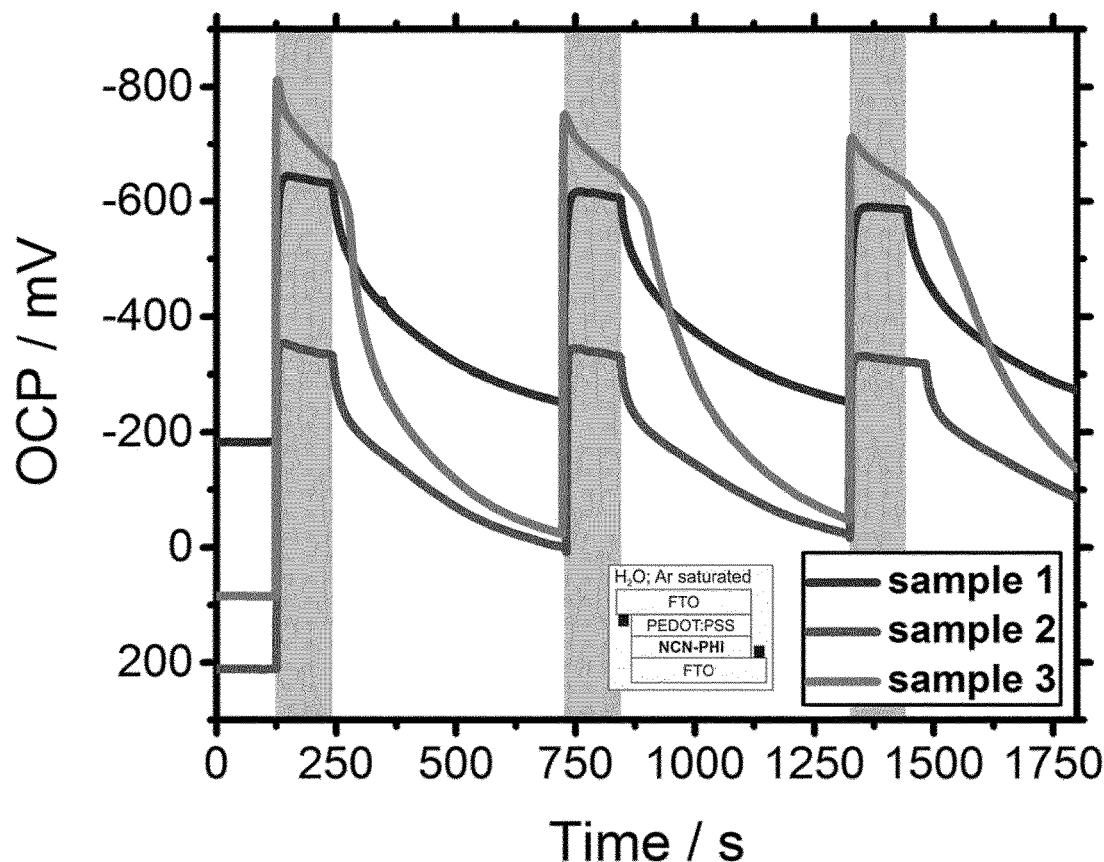

FIG. 20 displays OCP measurements of three different NCN-PHI—PEDOT:PSS samples sandwiched between two FTO substrates and measured under the same experimental conditions. Gray boxes represent illumination cycles (1 sun) with a duration of 2 min, followed by 45 min in the dark. In the inset, the cell geometry is shown.

Figure 21:
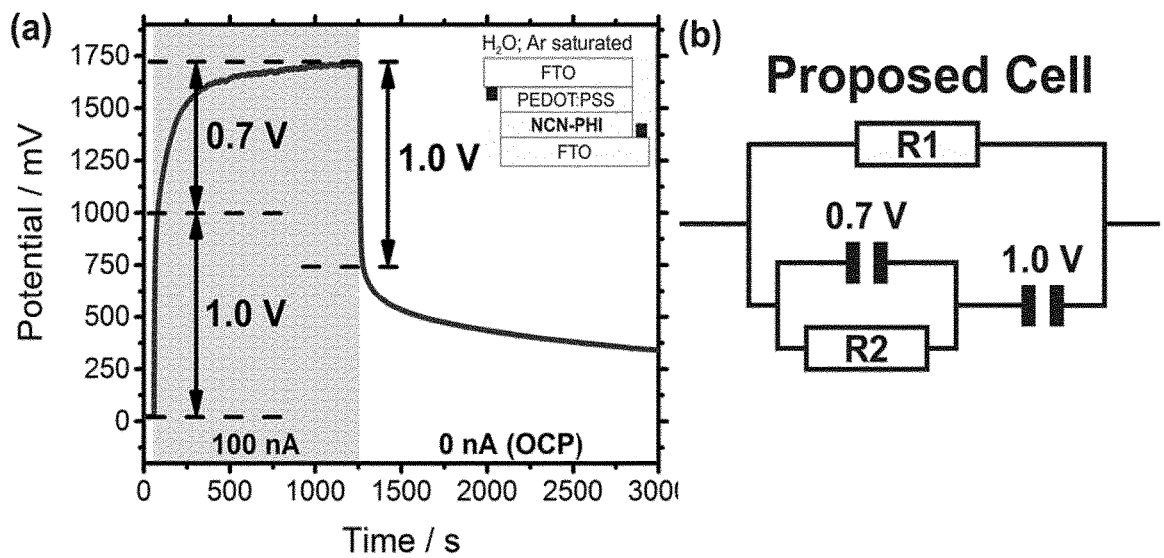

FIG. 21 (a) displays the electrical charging of a NCN-PHI PEDOT:PSS sample sandwiched between two FTO substrates. Charging cycle is represented by the gray box, using a current of 28 $mAg^{-1}$ over a time period of 20 min. Subsequently, OCP was measured to observe the charge decay. In the inset, the cell geometry is shown. FIG. 21 (b): Proposed equivalent circuit diagram for explaining the charging behavior of this system.

Figure 22:
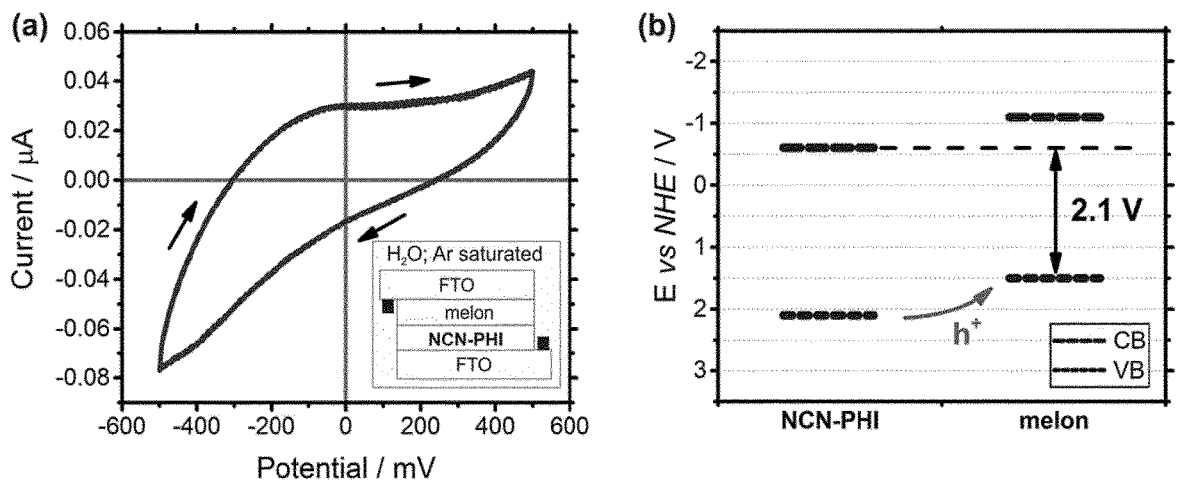

FIG. 22 (a) shows CV measurement of NCN-PHI and Melon, coated onto two separated FTO substrates and sandwiched subsequently together, using a scan rate of 10 mVs-1. In the inset, the sample geometry is shown. FIG. 22 (b) shows band positions of NCN-PHI and Melon.

Figure 23:
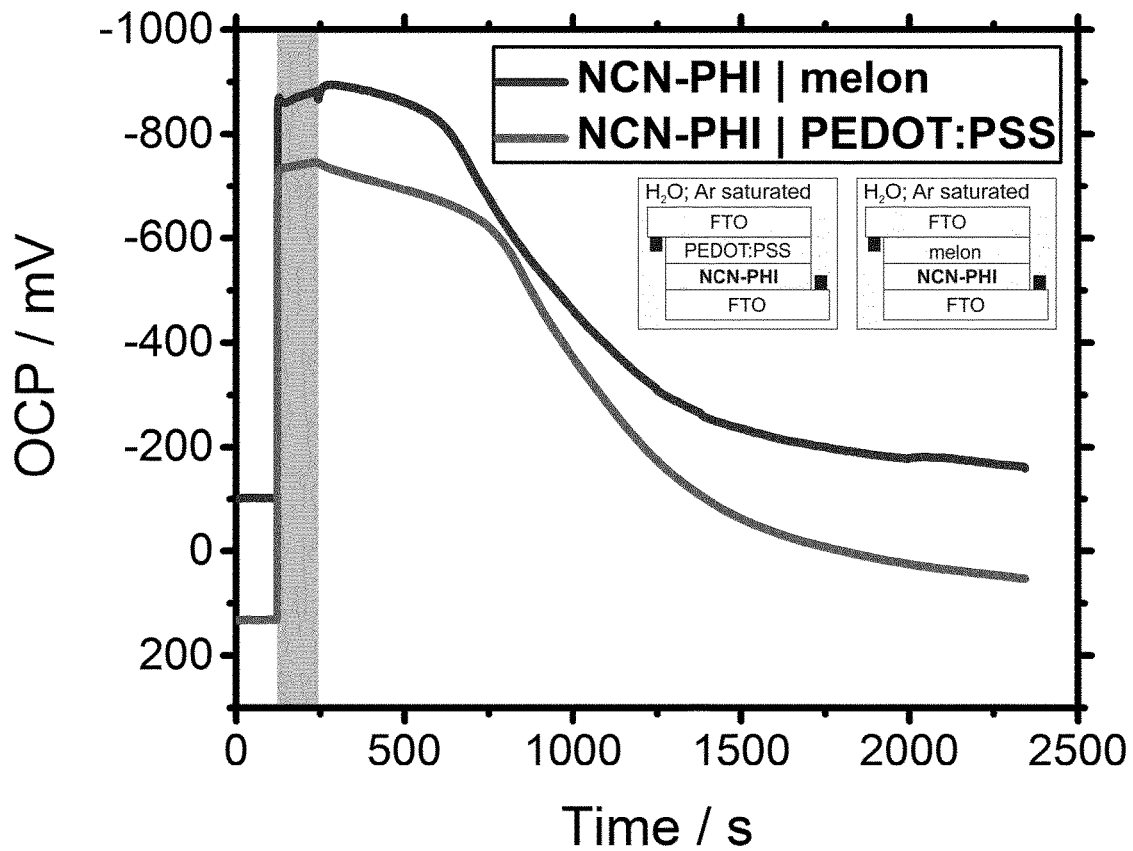

FIG. 23 displays OCP measurement of NCN-PHI and Melon, coated onto two separated FTO substrates and sandwiched together. One illumination cycle was performed with a duration of two minutes, shown with the gray box. The measurement is compared to the OCP observed for an equal cell, which uses PEDOT:PSS instead of Melon. The voltage stability after illumination highlights the possible application as autophotorechargable battery.

Figure 24:
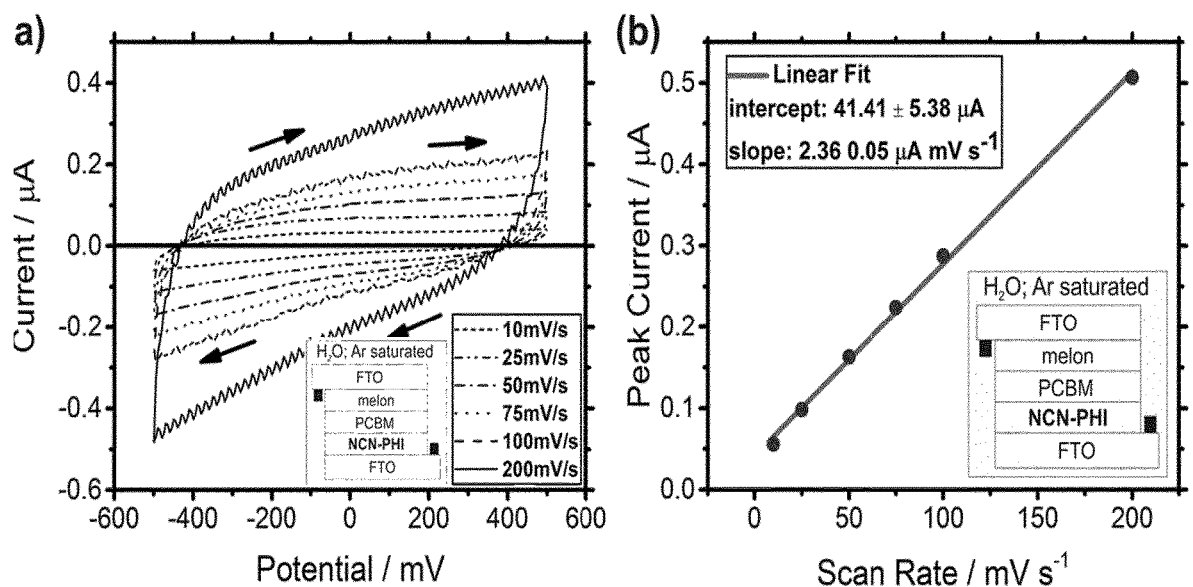

FIG. 24(a) shows CV measurements of NCN-PHI, the hole transport material PCBM and melon, coated onto two separated FTO substrates and sandwiched together in an oxygen free aqueous electrolyte. The measurement shows the dynamic storage of extraction of electrical energy.

FIG. 24(b) shows the linear correlation between scanrate and device current, highlighting a pseudocapacitive charge storage process.

DETAILED DESCRIPTION OF THE INVENTION

Electrochemical Device

As mentioned above, a first aspect of the present invention relates to an electrochemical device, comprising
 a negative electrode comprising a nitrogen-containing electron storage material,
 a positive electrode, and
 an electrolyte,
 wherein the nitrogen-containing electron storage material has a two-dimensional or a three-dimensional covalent structure, contains heptazine and/or triazine moieties, and is capable of intercalating and de-intercalating cations.

The electrochemical device within the meaning of the present invention is a device capable of either generating electrical energy from chemical reactions or using electrical energy to cause chemical reactions. Such a device, which generates an electric current, due to a spontaneous reaction, is called galvanic cell. Such device, which drives a non-spontaneous redox reaction through the application of electrical energy is called an electrolytic cell.

Negative Electrode and Positive Electrode

The negative electrode in the electrochemical device of the present invention is defined as the electrode at which electrons leave the cell and oxidation occurs, when the electrochemical device is in the charged state and operated as a galvanic cell. The positive electrode in the electrochemical device of the present invention is defined as the electrode at which electrons enter and reduction occurs, when the electrochemical device is in the charged state and operated as a galvanic cell. Each electrode may become either the anode or the cathode depending on the direction of current through the cell. The negative electrode of the galvanic cell is also referred to as the anode. The positive electrode of the galvanic cell is also referred to as the cathode.

The negative electrode comprises a nitrogen-containing electron storage material. The negative electrode comprises a substrate with a surface, and a layer of the nitrogen-containing electron storage material may be provided on the surface of the substrate.

The layer of the nitrogen-containing electron storage material may comprise the nitrogen-containing electron storage material in an amount of at least 80 wt.-%, preferably at least 90 wt.-%, in terms of the weight of the layer. The layer of the nitrogen-containing electron storage material may also contain a blend comprising the nitrogen-containing electron storage material. In this case, the blend contains at least 80 wt.-%, more preferably at least 90 wt.-%, and most preferably at least 95 wt.-% of the nitrogen-containing electron storage material.

The positive electrode may comprise a hole storage material. The positive electrode comprises a substrate with a surface, and a layer of the hole storage material may be provided on the surface of the substrate.

Substrate

For the negative and the positive electrode, the same or a different substrate may be used. The substrate of the electrodes is an electrically conductive material and is preferably selected from the group consisting of transparent conductive oxides, metals, conductive organic materials and doped semiconductors. The substrate may be in the form of a thin film. The substrate is more preferably a transparent conductive oxide such as indium tin oxide (ITO), fluorine doped tin oxide (FTC)) or doped zinc oxide.

Preparation of the Positive and the Negative Electrodes

Uniform thin films of the respective material can be deposited on the substrate of the negative and the positive electrode by the following techniques. Especially for multi-layered systems, optimizing deposition techniques should receive special attention to minimize possible pinholes and subsequent short-circuits. Small substrates are beneficial for the sandwich configuration of the samples, as it allows a more homogeneous pressure application.

Before deposition, the substrate may be treated in an oxygen plasma to activate the surface and make it more hydrophilic. This step can ensure a homogeneous surface wetting of the substrate with the respective deposition suspension. After plasma treatment, the respective deposition suspension is deposited on the substrate and subsequently dried. Multiple cycles of deposition may be performed and multiple layers of the same or different materials by be deposited on the substrate. Plasma cleaning is only carried out for the substrate prior to first deposition. Deposition may be performed by drop casting, by spin coating, by the Langmuir-Blodgett or by doctor blade technique. Several subsequent steps may be necessary due to the very weak interaction of the electron storage material and the substrate. After deposition, non-coated parts of the substrate may be sealed with epoxy for example, in order to avoid contact of the substrate and the electrolyte.

To create an electrical connection, wires may be attached to the substrate. Depending on sample, contacting may be performed before or after thin film deposition. Copper wires may be glued to the substrate by a conductive glue, such as a silver glue, and the joint may be sealed with epoxy glue.

Nitrogen-Containing Electron Storage Material

The nitrogen-containing electron storage material has a two-dimensional or a three-dimensional covalent structure and contains heptazine and/or triazine moieties. Thus, the nitrogen-containing electron storage material is a two-dimensional or a three-dimensional polymer comprising building blocks with heptazine and/or triazine moieties.

The nitrogen-containing electron storage material is preferably a material in which carbon and nitrogen strictly alternate. The heptazine and triazine moieties may be linked via their amino groups. The amino groups may be in the protonated charge-neutral form (—NH—) or in the deprotonated anionic form, as both shown in FIG. 18 for cyanamide-functionalized polyheptazine imide (NCN-PHI). Neutral or anionic NCN side groups may be attached. The nitrogen-containing electron storage material is preferably a material of the formula $C_xN_yH_z$, wherein x is in the range of 2 to 4, preferably 3, y is in the range of 3 to 5, preferably 4, and z is in the range of 0 to 1.5, preferably 0.5. The nitrogen-containing electron storage material is more preferably a two-dimensional polyheptazine imide or two-dimensional polytriazine imide, which may be optionally substituted with a functional group. The functional group is preferably cyanamide (see FIG. 18). The functionalized polyheptazine imide is most preferably a 2D cyanamide-functionalized polyheptazine imide (NCN-PHI).

The electron storage material having a two-dimensional or a three-dimensional covalent structure may also be a covalent organic framework (COF) or a metal organic framework (MOF) containing heptazine and/or triazine moieties and additional organic moieties. COFs are two-dimensional or three-dimensional organic solids with extended structures, in which building blocks are linked by strong covalent bonds. COFs are porous and crystalline and are made entirely from light elements such as H, B, C, N, and O. In the present invention, the COF preferably contains an aromatic moiety in addition to the heptazine and/or triazine moieties. For example, the COF may be a triazine-based COF consisting of alternating aromatic moieties and triazine moieties. The aromatic moiety is preferably a hydrocarbon moiety or a heterocyclic moiety. MOFs are compounds consisting of metal ions or clusters coordinated to organic ligands to form one-, two-, or three-dimensional structures. They are a subclass of coordination polymers.

The nitrogen-containing electron storage material is preferably a porous material, more preferably a microporous or mesoporous material. A microporous material is a material containing pores with a diameter of 2 nm or less, according to IUPAC nomenclature. A mesoporous material is a material containing pores with diameters in the range of 2 and 50 nm, according to IUPAC nomenclature.

The nitrogen-containing electron storage material is capable of intercalating and de-intercalating cations. More particularly, cations can be reversibly intercalated in the pores of the electron storage material. The electron storage material is preferably capable of intercalating and de-intercalating one or more cations selected from the group consisting of alkali metal ions, alkaline earth metal ions, transition metal ions, triel ions such as aluminum ions, lanthanide metal ions, ammonium ions, phosphonium ions, and organic ions. The cation is preferably one or more selected from the group consisting of Li, Na, K, Mg, ammonium, and Al.

In general, there are two distinct storage mechanisms for capacitors, namely electric double-layer capacitance and pseudocapacitance. Whereas the first mechanism stores charges in a thin double layer with a thickness of just a few angstroms, pseudocapacitance is a volume process involving redox reactions. An advantage of pseudocapacitance is a much higher charge density by a factor of 10 as a result of Faradaic reactions. A consequence of the pseudocapacitive behavior is that the charge stored on the system is strongly dependent on the potential as a result of thermodynamic reaction potentials. In cyclic voltammetry (CV) measurement, the influence of both storage mechanisms is evident.

A classical electric double layer capacitor has a rectangular CV shape, showing a sharp increase and decrease when potential sweep is changed. The surface process is very fast and can be explained solely by electrostatic effects. In this case, the current is dependent on the square root of the potential sweep rate (scan rate). In case of pseudocapacitors, charging and discharging currents depend linearly on the potential scanrate in its active potential region. In potentiostatic experiments, the current of a double layer capacitor is independent from the potential. In case of pseudocapacitors, the strong potential dependence is visible through the non-rectangular CV shape, due to a delay in potential, which is linked to slow kinetics of the corresponding redox reactions.

The capacity and stability of charge storage in the electron storage material is contingent on the pseudocapacitive incorporation of metal ions into the porous network (see also FIG. 17). The electron storage material acts as a pseudocapacitor by storing electrical energy faradaically by electron charge transfer between electrode and electrolyte. More particularly, upon reduction of the electron storage material during charging, electrons accumulate on the heptazine and/or triazine backbone and metal ions from the electrolyte intercalate in the pores. There is an interaction between these electrons accumulated on the heptazine and/or triazine backbone and the cations in the pores of the electron storage material, which stabilizes the negative charge of the electrode storage material. Thus, the pseudocapacitive incorporation of metal ions into the porous network is crucial for a high capacity and long-term electron storage, but at the same time limits the kinetics of the charge storage and release.

The application of the electron storage material is not limited by the water reduction reaction due to the high intrinsic overpotential of the electron storage material for hydrogen evolution, thus enabling new applications with more negative anode potentials for aqueous batteries. For cyanamide-functionalized polyheptazine imide (NCN-PHI), the potentials for electron storage are more negative than −700 mV vs. Ag/AgCl in phosphate buffer and even below −800 mV in KCl (corresponding to −100 mV and −200 mV vs. RHE at pH7). Hence, the long-term stability of the charge storage on NCN-PHI is remarkable.

The nitrogen-containing electron storage material has preferably a band gap in the range of 0.5 to 3.5 eV, and preferably a band gap in the range of 1.0 to 2.0 eV or 2.0 to 3.0 eV. The band gap refers to the energy difference between the top of the valence band and the bottom of the conduction band. A material with a large almost insurmountable band gap of more than 3.5 eV is an insulator. A material with a band gap of 0.5 to 3.5 eV is semiconducting. On the one hand, in order to increase visible light absorption, the band gap of the electron storage material is preferably low. Visible light within the meaning of the present invention is light having a wavelength in the range of 380 to 700 nm. On the other hand, a higher band gap enables a higher cell voltage. A band gap of 1.0 to 2.0 or 2.0 to 3.0 eV allows for a reasonable trade-off between visible light absorption and a high cell voltage. When the band gap is in the range of 1.0 to 2.0 eV, the light absorption, and thus the energy conversion efficiency, is improved. When the band gap is in the range of 2.0 to 3.0 eV, a higher cell voltage and hence energy density can be obtained.

Hence, the nitrogen-containing electron storage material can absorb light to excite electrons, and store the exited electrons therein.

The band gap of the nitrogen-containing electron storage material can be tuned by cations (interlayer and cave doping), by anions (caves and substitution doping), and by copolymerisation (molecular doping). In terms of non-metal anionic doping, carbon self-doping may replace bridging nitrogen atoms. Oxygen, sulfur, and iodine doping on the other hand may replace nitrogen atoms from the aromatic rings.

The nitrogen-containing electron storage material may comprise up to 40 mol %, preferably up to 25 mol %, more preferably up to 10 mol %, and most preferably up to 5 mol % of at least one member of the list consisting of S, B, P, O, C, I, F, Cl, Se, Te, Si, Ge, As, Sb, alkali cations, alkaline earth cations, and transition metal ions. These elements and cations may be used as dopants, substituents or intercalants of the nitrogen-containing electron storage material, in order to modify its properties.

The alkali cation is preferably selected from Li, Na, K. The alkaline earth cation is preferably selected from Mg and Ca. The transition metal ion is preferably selected from the group consisting of Zn, Fe, Al, Cu, and Ni.

Hole Storage Material

In semiconductors, the band gap is not as large as in insulators, so that electrons can be moved into the conduction band. The promotion of electrons leaves a positively charged vacancy in the valence, which is referred to as a hole. These holes can be moved through the material by the transfer of an electron to the vacancy. Therefore, holes are considered to be mobile. A hole storage material within the meaning of the present invention is a hole acceptor or a molecular species that can be oxidized by the hole.

Generally, storage is governed by the total amount of oxidized or reduced material. Large storage capacities are attributed to fast redox kinetics and the fact that charging happens through the volume of the system.

The hole storage material (HTM) of the positive electrode may contain or be a conducting polymer, a metal, a semiconductor or a mixture thereof.

The conducting polymer is preferably selected from the group consisting of polyacetylene, polyparaphenylene, polyparaphenylene sulfide, polyparaphenylene vinylene, polythiophene, polyisothianaphthene, polynaphthalenes, polyphenylenes, polyphenylene vinylenes, polypyrrole, polyaniline, polycarbazoles, polyindoles, polyazepines, poly (3,4-ethylenedioxythiophene), poly(p-phenylene sulfide), carbon nitrides, and doped variants thereof. The conducting polymer is more preferably selected from the group consisting of polythiophenes, poly(3,4-ethylenedioxythiophene) (PEDOT), poly(3,4-ethylenedioxythiophene) polystyrene sulfonate (PEDOT:PSS), and melon, polycarbazoles, polyindoles, polyazepines, polythiophenes, polyisothianaphthene, polyacetylenes, polyazulenes, poly(3, 4-ethylenedioxythiophene), carbon nitrides, quinones, copolymers of thiophenes with polyfluorenes, polycarbazoles, polydibenzosiloles, benzothiadiazoles and diketopyrrolopyrroles, copolymers of selenophenes with polyfluorenes, polycarbazoles or polydibenzosiloles, benzothidiazole and diketopyrrolopyrrol, compounds comprising N-O-bonded oxygen as radical center, quinone-based acenes, compounds comprising carbon centered radical cations, compounds comprising tertiary amine centered radicals, as well as doped variants of all of them.

The conducting polymer is more preferably selected from the group consisting of polyacetylene, polyparaphenylene, polyparaphenylene sulfide, polyparaphenylene vinylene, polythiophene, polyisothianaphthene, polynaphthalenes, polyphenylenes, polyphenylene vinylenes, polypyrrole, polyaniline, polycarbazoles, polyindoles, polyazepines, poly (3,4-ethylenedioxythiophene), poly(p-phenylene sulfide), carbon nitrides, and doped variants thereof. The conducting polymer is more preferably selected from the group consisting of polythiophenes, poly(3,4-ethylenedioxythiophene) (PEDOT), poly(3,4-ethylenedioxythiophene) polystyrene sulfonate (PEDOT:PSS), and melon. The p-doped conducting polymer PEDOT:PSS is most preferred. Taking the high conductivity and fitting band positions into account, PEDOT:PSS is an ideal material for HTM and HSM applications in solar batteries. The hole transport conducting polymer may also act as a hole storage material (HSM), as the respective mechanism is linked. Separation can only be achieved when adding a HSM onto the HTM with a large enough driving force for holes.

The hole storage material is preferably selected from the group consisting of polyacetylene, polyparaphenylene, polyparaphenylene sulfide, polyparaphenylene vinylene, polythiophene, polyisothianaphthene, polynaphthalenes, polyphenylenes, polyphenylene vinylenes, polypyrrole, polyaniline, polycarbazoles, polyindoles, polyazepines, poly (3,4-ethylenedioxythiophene), poly(p-phenylene sulfide), carbon nitrides, and doped variants thereof. The conducting polymer is more preferably selected from the group consisting of polythiophenes, poly(3,4-ethylenedioxythiophene) (PEDOT), poly(3,4-ethylenedioxythiophene) polystyrene sulfonate (PEDOT:PSS), and melon, polycarbazoles, polyindoles, polyazepines, polythiophenes, polyisothianaphthene, polyacetylenes, polyazulenes, poly(3, 4-ethylenedioxythiophene), carbon nitrides, quinones, copolymers of thiophenes with polyfluorenes, polycarbazoles, polydibenzosiloles, benzothiadiazoles or diketopyrrolopyrroles, copolymers of selenophenes with polyfluorenes, polycarbazoles or polydibenzosiloles, benzothidiazole and diketopyrrolopyrrol, compounds comprising N-O-bonded oxygen as radical center, quinone-based acenes, compounds comprising carbon centered radical cations, compounds comprising tertiary amine centered radicals, as well as doped variants of all of them.

The hole storage material is more preferably selected from the group consisting of polynaphthalenes, polyphenylenes, polyphenylene vinylenes, polyanilines, polypyrroles, polycarbazoles, polyindoles, polyazepines, polythiophenes, polyacetylenes, polyazulenes, poly(3,4-ethylenedioxythiophene), poly(p-phenylene sulfide), carbon nitrides, quinones, tertiary amines, copolymers of thiophenes with polyfluorenes, polycarbazoles, polydibenzosilols, benzothiadiazoles or diketopyrrolopyrroles, copolymers of selenophenes with polyfluorenes, polycarbazoles or polydibenzosilols, benzothidiazole and diketopyrrolopyrrol, compounds comprising N-O-bonded oxygen as radical center, quinone-based acenes, as well as doped variants of all of them. Suitable classes of hole storage and hole transport materials are listed in Table 2. These materials can also be used as hole storage materials in the present invention.

The hole storage material (HTM) of the positive electrode may also be a semiconductor such as graphene oxide (GO). GO represents a non-stoichiometric material class, synthesized through partial oxidation of graphene by, e.g., using an oxidizing agent such as hydrazine, via thermal annealing reduction, or using a photocatalyst.

TABLE 2

Classes of hole storage and hole transport materials

| Class | Material Derivatives | Reference/doi | Application | Optical Bandgap | Potentials |
|---|---|---|---|---|---|
| Polythiophene | Linear self assembled, branched Polythiophenes, 3-alkyl/aryl substituted | 10.1126/science.280.5370.174110.1021/jp1035629 10.1021/ma00100a039 | HTM/HSM | 1.8-2.6 eV | 0.2-0.5 vs Fc/Fc+ 0.8-1.4 V vs Ag/AgCl |
| Polynaphthalenes | poly(naphthalene-1,4-diyl)-type poly(naphthalene-2,6-diyl)-type | 10.1002/(SICI)1099-0518(19960430)34%3A6<997%3A%3AAID-POLA9>3.0.00%3B2-F | HSM/HTM | | −0.98 V vs Hg −0.83 V vs Hg |
| Polyphenylenes | poly(p-phenylene) | 10.1002/(SICI)1099-0518(19960430)34%3A6<997%3A%3AAID-POLA9>3.0.00%3B2-F | HSM/HTM | | ERed = 0.35 V vs Hg |
| Polyphenylene vinylenes | p-PPV | 10.1016/S0379-6779(00)00282-4 | HSM/HTM | | Synth. −1.4 vs Ag/AgBr |
| Polyaniline | Transition metal doped PANI As Nanocomposite with MoO3 | 10.1016/j.ces.2016.06.055 10.1021/ma035677w 10.1002/asia.201000770 | HTM/HSM HSM/HTM | 1.5-2 eV | 0.2-0.9 V vs Ag/AgCl 0.5 V vs SCE |
| Polypyrrole | Polypyrrole on carbon nanotubes, SiO2 | 10.1016/j.pnsc.2008.03.002 10.1016/j.ssc.2006.08.002 | HSM/HTM | 3-4 eV | 0-0.6 V vs Ag/AgCl |
| Polycarbazoles | Cross-linked with polythiophene Cross-linked polycarbazole with alkyl and ether side chains. Triazine-, Triphenylamine- or | 10.1149/07711.1681ecst 10.1016/j.orgel.2011.08.018 10.1016/j.orgel.2011.08.018 | HSM/HTM | 1.3-1.5 eV and 3.0-3.2 eV | 0.6-1.2 V vs Ag/AgCl 0.8 V vs Fc/Fc+ |
| Polyindoles | e.g. Pure Pin Doped with HClO4 | 10.1007/s00289-018-2458-z 10.1016/j.ejbas.2014.12.006 10.1016/j.synthmet.2016.05.033 | HSM/HTM | 4.6-5.0 eV 2.1-1.7 eV And >3.0 eV | Capacitive behavior 0.8 V vs Ag/AgCl (mobility of 14.5 S/cm) |
| Polyazepines | With doping agents such as I2 or AsF5 | 10.1021/ja00229a043 | HTM/HSM (mobility of $10^{-2}$ S/cm) | 2.7-4.9 eV | (mobility of $10^{-2}$ S/cm) |
| Polyacetylenes | Doped quaternary ammonium ions or sulfonates | 10.1021/ja016715z 10.1021/ja046880p | HSM/HTM | 1.9-2.3 eV | 0.2-0.4 V vs SCE |
| Polyazulenes, C-centered radical cation | e.g. Pure 1,3-Polyazulene, or doped with I2, ClO4— | 10.1021/o10274615 10.1016/0038-1098(86)90736-2 | HSM/HTM | 2.6-3.5 eV | 0.7 V vs Ag/AgCl |
| Quinones | Alkyl substituted 1,4 dimethoxybenzene, co-polymerized with alkyl/aryl-diamines | 10.1038/srep32102 10.1039/c7ta08489g | HSM/HTM HSM/HTM | 2.6-3.1 eV 3.6-4.8 eV | 3.7 V vs Li/Li+ 0-0.7 V vs Ag/AgCl |
| Tertiary amine centered radical | Triphenylamine, polytriphenylamine | 10.1039/c6ta10127e 10.1002/anie.201204106 10.1016/j.electacta.2014.12.092 | HTM but also HSM | 2.4-2.8 eV | 3.2-4.2 V vs Li/Li+ −0.3-0.6 V vs Fc/Fc+ +0.6-1.3 V vs Ag/AgCl |
| Polyfluorene/ Polycarbazole/ | PFDTBT PFO-DBT | 10.1063/1.2836266 10.1038/nmat1928 | HTM/HSM HTM/HSM | 1.5-1.9 eV | 0.8-1 V vs SHE |

TABLE 2-continued

Classes of hole storage and hole transport materials

| Material | | | | Optical | |
|---|---|---|---|---|---|
| Class | Derivatives | Reference/doi | Application | Bandgap | Potentials |
| Polydibenzosilole co-polymerized with thiophenes (or Selenophenes) and/or benzothidiazole And/or diketopyrrolopyrrol (DPP) | PSiF-DBT PCPDTBT DPPDBTE DPPDBE | 10.1063/1.4902990 10.1021/ja405112s | | 1.5 eV and 2.7 eV | [HOMO (−5.5) eV] 0.9-1.0 V vs Ag/AgCl |
| N—O bonded oxygen as radical center | nitroxyl, nitronylnitroxide, 2,2,6,6-tetramethylpiperidine-1-oxyl (TEMPO) bearing polymers such as polystyrene, polymethacrylate, polynorbornene, Polyethers | 10.1021/ma302278h 10.1016/j.eurpolymj.2011.09.002 10.1002/adma.201003525 10.1021/ma0628578 10.1021/ma702576z | HTM/HSM | 3.5-4.1 eV | 0.6-0.9 V vs Ag/AgCl 3.6 V vs Li/Li+ |

Electrolyte

An electrolyte within the meaning of the present invention is a substance that conducts electric current as a result of dissociation into cations and anions, which migrate toward the negative and positive electrode, respectively. The electrolyte may be a liquid electrolyte or a solid electrolyte. The electrolyte is preferably one or more selected from the group consisting of an organic liquid electrolyte, an inorganic liquid electrolyte, a solid polymer electrolyte, a gel polymer electrolyte, a solid inorganic electrolyte, and a molten inorganic electrolyte. The electrolyte is more preferably an aqueous solution of one or more metal salts. The electrolyte may also be a non-aqueous organic solvent and a metal salt. The metal salt is preferably one or more of an alkali metal salt and an alkaline earth metal salt, and most preferably an alkali metal salt. When the electrolyte contains alkali metal cations or alkaline earth metal cations, the pseudocapacitive incorporation of metal ions into the porous network is improved. Examples of the anion of the metal salt include $F^-$, $Cl^-$, $I^-$, $I_3^-$, $NO_3^-$, $(CF_3)_2PF_4^-$, $(CF_3)_3PF_3^-$, $(CF_3)_4PF_2^-$, $BF_4^-$, $PF_6^-$, $H_2PO_4^-$, $HPO_4^{2-}$, $PO_4^{3-}$, $CF_3CF_2SO_3^-$, $(CF_3SO_2)_2N^-$, $(FSO_2)_2N^-$, $CF_3CF_2(CF_3)_2CO^-$, $(CF_3SO_2)_2CH_3^-$, $(SF_5)_3C_3^-$, $CF_3SO_2^-$, $CF_3^-$, $CF_3CO_2^-$, $CH_3CO_2^-$, $SCN^-$, and $(CF_3CF_2SO_2)_2N^-$.

The electrolyte contains preferably cations that the nitrogen-containing electron storage material is capable of intercalating and de-intercalating.

The electrolyte may comprise a redox shuttle or a solid state charge transport medium. A solid state charge transport medium is a solid state electrolyte such as a solid polymer electrolyte, a gel polymer electrolyte, or a solid inorganic electrolyte. A redox shuttle within the meaning of the present invention refers to an electrochemically reversible moiety, which, during charging of the electrochemical device, acts as a hole transport medium or electron transport medium to transport positive or negative charges. During charging of the electrochemical device, the electrochemically reversible moiety migrates between the negative and the positive electrode, in order to transport holes to the hole storage material. The redox shuttle may be liquid redox shuttle, i.e. an electrochemically reversible moiety in liquid phase. The electrochemically reversible moiety is preferably an earth abundant redox couple, such as iodine/iodide.

The negative electrode in electrochemical device according to the first aspect of the invention may further comprise a layer provided on the surface of the layer of the nitrogen-containing electron storage material, wherein the layer comprises the nitrogen-containing electron storage material and a charge transport material. In this case, the layer contains preferably at least 60 wt.-%, more preferably at least 80 wt.-%, and most preferably at least 90 wt.-%, of the nitrogen-containing electron storage material. The layer may consist of a blend of the nitrogen-containing electron storage material and a charge transport material or of a layered structure of these materials. Blending the nitrogen-containing electron storage material with a charge transport material allows the creation of a bulk heterojunction, which may enhance the electrode kinetics.

Photorechargeable Battery

In a second aspect, the present invention relates to a photorechargeable battery, comprising a negative electrode comprising a substrate with a surface and a layer comprising a nitrogen-containing electron storage material provided on the surface of the substrate, and a positive electrode comprising a substrate with a surface and a layer comprising a hole storage material provided on the surface of the substrate, and a photovoltaic element sandwiched between the layer of the nitrogen-containing electron storage material and the layer of the hole storage material, wherein the photovoltaic element is capable of charging the electrodes upon illumination, and wherein the nitrogen-containing electron storage material has a two-dimensional or a three-dimensional covalent structure, contains heptazine and/or triazine moieties, and is capable of intercalating and de-intercalating cations.

A photorechargeable battery within the meaning of the present invention is a battery, which can be charged by exposure to light, without having to apply an external voltage.

The photovoltaic element is capable of charging the electrodes upon illumination. Hence, a photovoltaic element within the meaning of the present invention is an electrical device that converts the energy of light directly into electricity by the photovoltaic effect. The photovoltaic effect is defined as the creation of voltage in a material upon exposure to light.

The positive and the negative electrode as defined in the first aspect of the present invention may be used in the photorechargeable battery according to the second aspect of the present invention. Hence, the preferred embodiments of the substrates, the hole storage material, and the nitrogen-containing electron storage material, and the electrolyte and further embodiments as defined in the first aspect of the invention can also be applied to the photorechargeable battery. In particular, the nitrogen-containing electron storage material is preferably as defined in the first aspect of the present invention. The layer of the nitrogen-containing electron storage material may comprise the nitrogen-containing electron storage material in an amount of at least 80 wt.-%, preferably at least 90 wt.-%, in terms of the weight of the layer.

The layer of the nitrogen-containing electron storage material may comprise the nitrogen-containing electron storage material in an amount of at least 80 wt.-%, preferably at least 90 wt.-%, in terms of the weight of the layer.

The photovoltaic element is preferably a semiconductor or semiconductor composite containing a p-n-junction. A p-n junction is a boundary or interface between two types of semiconductor materials, p-type and n-type, inside a single crystal of semiconductor. The photovoltaic element is more preferably a layer structure of p-type and n-type semiconductors, and most preferably a layer structure of a layer of a p-type semiconductor and a layer of an n-type semiconductor. In this configuration, the layer of the n-type semiconductor is in contact with the surface of the layer of the electron storage material opposite to the substrate of the negative electrode, and the layer of the p-type semiconductor is in contact with the surface of the layer of the hole storage material opposite to the substrate of the positive electrode. In this configuration, the p-type semiconductor layer and the n-type semiconductor layer are in contact.

An inverted configuration of the photovoltaic element, in which the p-type semiconductor is in contact with the electron storage material and the n-type semiconductor is in contact with hole storage material, with an ohmic contact in-between the n-type and the p-type semiconductor, is also possible (so called "Z-Scheme")

The p-type and the n-type semiconductor have a lower band gap compared to the electron storage material. By absorption of the sunlight by the p-type and the n-type semiconductor having a lower band gap, the efficiency of visible light absorption and hence charge storage can be improved. Due to the larger energy gap between the electron and hole storage material compared to the p-type and the n-type semiconductor (especially in the Z-scheme approach), a high cell voltage can be maintained.

Autophotorechargeable Battery

In a third aspect, the present invention relates to an autophotorechargeable battery, comprising
a negative electrode comprising a substrate with a surface and
a layer comprising a nitrogen-containing electron storage material provided on the surface of the substrate,
a positive electrode comprising a substrate with a surface, and a layer comprising a hole storage material provided on the surface of the substrate, and
an electrolyte,
wherein the nitrogen-containing electron storage material has a two-dimensional or a three-dimensional covalent structure, is capable of intercalating and de-intercalating cations, and has a band gap in the range of 0.5 to 3.5 eV.

The layer of the nitrogen-containing electron storage material may comprise the nitrogen-containing electron storage material in an amount of at least 80 wt.-%, preferably at least 90 wt.-%, in terms of the weight of the layer.

As mentioned above, a photorechargeable battery within the meaning of the present invention is a battery, which can be recharged by irradiation of visible light, without having to apply a voltage. An autophotorechargeable battery within the meaning of the present invention is a photorechargeable battery, wherein both steps of light harvesting and electrical energy storage occur within the same material, namely in the nitrogen-containing electron storage material. Hence, light harvesting and charge storage are combined in the same material. More particularly, in the nitrogen-containing electron storage material, electrons are excited upon illumination and stored in a photoexcited state. Thus, the autophotorechargeable battery is able to create a photopotential and to provide a current during, and in particular, after illumination. Hence, the nitrogen-containing electron storage material can absorb light to excite electrons, and store the exited electrons therein.

The autophotorechargeable battery of the present invention is distinct form a battery, which can only undergo photo-assisted charging and de-charging and cannot be charged by irradiation, without applying a voltage. The autophotorechargeable battery of the present invention is also distinct form a photorechargeable battery according to the second aspect of the invention, in which light harvesting and electron storage does not take place in the same material.

The electrode of the autophotorechargeable battery is preferably an electrode as defined in the first aspect of the present invention. More particularly, the nitrogen-containing electron storage material used in the autophotorechargeable battery is preferably an electron storage material as defined in the first aspect of the present invention. More particularly, the electron storage material preferably contains heptazine and/or triazine moieties, is more preferably a material in which carbon and nitrogen atoms alternate, and most preferably a cyanamide-functionalized polyheptazine imide. The electron storage material may also be a covalent organic framework (COF) or a metal organic framework (MOF), as defined in the first aspect of the present invention.

The nitrogen-containing electron storage material used in the autophotorechargeable battery may also be a two- or three-dimensional nitrogen-containing electron storage material containing five-membered or six-membered ring moieties, preferably aromatic and/or nitrogen-containing five-membered or six-membered ring moieties, and most preferably aromatic five-membered or six-membered rings containing nitrogen in the ring or a functional group located at the ring. The nitrogen-containing electron storage material used in the autophotorechargeable battery may also be a two- or three-dimensional nitrogen-containing electron storage material containing one or more moieties selected from the group consisting of N—O bonded oxygen, N—N bonded nitrogen and C—O bonded oxygen as radical center.

Preferred moieties of the building units of the nitrogen-containing electron storage material are given in Table 1.

TABLE 1

Building units of the electron storage materials and conductive polymers

| Building unit | Reference | Optical bandgap | potential |
|---|---|---|---|
| N—N bonded nitrogen as radical center like verdazyl, hydrazyle (DPPH = Dipehnylpicrylhydrazyl) | DOI: 10.1002/pola.28042<br>DOI: 10.1039/c4py00829<br>Polym. Chem. 2014, 5, 5223-5226.<br>J. Polym. Sci., Part A: Polym. Chem. 2016, 54, 1803-1813.<br>Adv. Electron. Mater. 2016, 2, 1600253.<br>DOI: 10.1080/13510002.2017.1364330<br>https://www.electrochem.org/dl/interface/wtr/wtr05/wtr05_p32-36.pdf | 2.2-4.9 eV | 0.2-0.88 and −0.48-−1.01 vs Ag/AgCl |
| N—O bonded oxygen as radical center like nitroxyl, nitronylnitroxide | DOI: 10.1002/marc.200700300<br>DOI: 10.1039/COPY00308E<br>DOI: 10.1021/cm9504551<br>DOI: 10.1016/j.solener.2018.02.026<br>DOI: 10.1016/j.electacta.2017.03.068<br>DOI: 10.1021/ma0628578<br>DOI: 10.1002/adma.201003525<br>DOI: 10.1039/C4NJ00012A<br>DOI: 10.1016/j.electacta.2017.11.168<br>DOI: 10.1021/jp040634i<br>DOI: 10.1039/c7py02001e<br>DOI: 10.1021/cm901374u | 1.4-5.1 eV | 0.6-1.5 V vs Ag/AgCl and −0.6-−1 V vs Ag/AgCl; VB: −5.2 eV |
| C—O bonded oxygen as radical center like galvinoxyl diimide polymers, phenoxyl- and N containing containing polymers, oxophenalenoxyl diimide | DOI: 10.1002/adma.200803073<br>http://www.formatex.info/polymerscience1/book/566-578.pdf<br>DOI: 10.1039/C0SC00287A<br>DOI: 10.1002/marc.201500702<br>DOI: 10.1002/marc.201300791<br>DOI: 10.1039/C5DT03131A<br>DOI: 10.1038/NMAT3142<br>doi: 10.1351/pac200880030507 | 0.6-3.3 eV | 0-−0.8 V vs Ag/AgCl; 2.0-2.5 V vs Li; −2.3-−2.4 V vs Fc/Fc+ |
| 5 rings containing one or more heteroatoms like N, S, P, Se, Te, B, ... e.g. Imidazol, Pyrazol, Diazole, Benzothiazol, benzothiadiazole, Thienopyazine, Isoindigo | DOI: 10.1039/b915995a<br>DOI: 10.1039/c3tc32008a<br>DOI: 10.1039/c5cs00650c<br>DOI: 10.1016/S0014-3057(98)00268-7<br>DOI: 10.1016/S0379-6779(97)80827-2<br>DOI: 10.1039/c5cs00650c<br>DOI: 10.1021/acs.jpcc.8b01434<br>DOI: 10.1039/c4ra00335g<br>ISBN: 978-1-118-85874-5 | 1.7-2.9 eV | 0.2-0.7 V vs Fc/Fc+ Red: −0.2-−0.7 V vs SCE Ox: 0.2-0.7 V vs SCE; Ox: 0.93-1.67 V vs Ag/AgCl red: −1.52 V vs Ag/Ag+ |
| 6 rings containing one or more heteroatoms like N, O, S, P, Se, Te, B, ... e.g. pyidinium, Phenantroline, Xanthen dyes (e.g. rodamine), thiazine, oxazime, triazine, tetrazine, chinoxaline, phenazine, viologen, flavine, bipyridine and terpyridine complexes, biquinoline and complexes, pyrazine, Polyborazines/borazyline, polyaminoborane | DOI: 10.1021/acsomega.7b01887<br>DOI: 10.1039/c6ta05784e<br>DOI: 10.1016/j.electacta.2014.12.116<br>DOI: 10.4236/ojic.2013.31002<br>DOI: 10.1039/c0pp00317d<br>DOI: 10.1016/j.apcatb.2018.08.005<br>DOI: 10.1002/anie.201801112<br>DOI: 10.1039/c8cc00957k<br>DOI: 10.1039/c6ta06449c<br>DOI: 10.1002/anie.201202476<br>DOI: 10.1002/app.4086<br>DOI: 10.1038/nenergy.2017.74<br>DOI: 10.1039/c7gc00849<br>DOI: 10.1039/b9nj00757a<br>DOI: 10.1039/B9NJ00757A<br>DOI: 10.1007/s11426-012-4556-3<br>DOI: 10.1002/ejoc.200600376<br>DOI: 10.1039/b408479a<br>DOI: 10.1016/j.jphotochem.2011.02.025<br>DOI 10.1007/s10965-016-0945-1<br>DOI: 10.1016/j.chempr.2017.11.001<br>DOI: 10.1039/c4dt0034<br>DOI: 10.1149/1.3652840<br>DOI: 10.1021/ja060470e<br>ISBN: 978-0-470-798-9<br>DOI: 10.1002/ejic.200900044,<br>DOI: 10.1002/ange.201607131<br>DOI: 10.1021/ja063519p | 1.3-4.0 eV | −2-−0.7 V vs Fc/Fc+; 0.2-0.75 V vs Ag/AgCl and −0.2-−1.7 V vs Ag/AgCl |

TABLE 1-continued

Building units of the electron storage materials and conductive polymers

| Building unit | Reference | Optical bandgap | potential |
|---|---|---|---|
| Phenyl-ring amine bridged | DOI: 10.1016/j.jsamd.2016.08.001<br>DOI: 10.1002/anie.201607820<br>Int. J. Electrochem. Sci., 7(2012)10666-10678 | 1.7-3.8 eV | 3.0 and 3.9 V vs. Li |
| Polycyclic aromatic carbon compounds with heteroatoms, N, O, S, P, Se, Te like imin/amin bidged pyren-tetraone, imin/amin bidged quionone, imin/amin bidged phenanthrene, tetracyanoquinone, dicyanobenzoquinone, Phenyl naphthalene diimide, napthalene diimide, PBFI (tetraazabenzodifluo ranthene diimide), Hexaazatriphenylene | DOI: 10.1021/cm00010a002<br>DOI: 10.1016/j.jtusci.2014.12.003<br>DOI: 10.1021/ja067475w<br>DOI: 10.1002/aenm.201100795<br>DOI: 10.1016/j.electacta.2015.07.163<br>DOI: 10.1021/ja206961t<br>DOI: 10.1002/aenm.201601415<br>DOI: 10.1039/c4ta01138d<br>DOI: 10.1021/acsmacrolett.8b00154<br>DOI: 10.1016/j.dyepig.2016.04.046<br>DOI: 10.1038/NMAT4919<br>DOI: 10.1002/aenm.201100795<br>DOI: 10.1039/B312349A<br>CHEM. RES. CHINESE UNIVERSITIES 2009, 25(6), 950-956<br>DOI: 10.1039/c3cc39141<br>ISBN 978-3-642-27620-0<br>DOI: 10.1557/mrc.2017.127<br>DOI: 10.1021/acs.chemmater.5b01274<br>DOI: 10.1021/ja407471b<br>DOI: 10.1021/ma502042<br>DOI: 10.1039/c5cs00181a | 0.9-4.8 eV | Red: −0.27-−1.2 eV vs. Ag/AgCl;<br>Ox: 1.3 V vs Ag/AgCl;<br>1.8-2.5 eV vs Li 0.2-0.85 V vs SHE<br>−0.58 vs Fc/Fc+;<br>−1-−2 V vs Ag/Ag+ |

The nitrogen-containing electron storage material used in the autophotorechargeable battery may also be a two- or three-dimensional nitrogen-containing electron storage material containing five-membered or six-membered ring moieties, wherein the five-membered or six-membered ring moieties containing one or more elements selected from the group of S, B, P, O, Se, Te, Si, Ge, As, and Sb.

The electron storage material used in the autophotorechargeable battery has a band gap in the range of 0.5 to 3.5 eV, and preferably a band gap in the range of 1.0 to 2.0 or 2.0 to 3.0 eV. As discussed above, a material with a band gap of 1.0 to 2.0 or 2.0 to 3.0 eV allows for a reasonable trade-off between visible light absorption and a high cell voltage. When the band gap is in the range of 1.0 to 2.0 eV, the light absorption, and thus the energy conversion efficiency, is maximized.

The positive electrode may be a positive electrode as defined in the first aspect of the present invention. In particular, the hole storage material may be a material as defined in the first aspect of the present invention. Suitable hole storage and hole transport materials are listed in Table 2. These materials may also be used in the present invention.

In the autophotorechargeable battery, substrates for the positive and the negative electrode and an electrolyte as defined in the first aspect may be used. The electrolyte used in the autophotorechargeable battery may be an aqueous medium, which is suitable for large scale production at low-cost, more ecological, and less hazardous compared to most electrolytes in conventional batteries.

The autophotorechargeable battery according to the third aspect of the present invention may preferably contain a hole transport material (HTM). A layer of a hole transport material maybe sandwiched between the electron storage material and the hole storage material. The hole transport material is preferably a conducting material, and more preferably a conducting polymer. The hole transport material is preferably a material selected from the group consisting of polynaphthalenes; polyphenylenes; polyphenylene vinylenes; polyparaphenylene; polyparaphenylene sulfide; polyparaphenylene vinylene; polyanilines; polypyrroles; polycarbazoles; polyindoles; polyazepines; polythiophenes; polyisothianaphthene; polyacetylenes; polyazulenes; poly(3,4-ethylenedioxythiophene); carbon nitrides; quinones; copolymers of thiophenes with polyfluorenes, polycarbazoles, polydibenzosiloles, benzothiadiazoles or diketopyrrolopyrroles; copolymers of selenophenes with polyfluorenes, polycarbazoles or polydibenzosiloles; benzothidiazole; diketopyrrolopyrrol; compounds comprising N-O-bonded oxygen as radical center; quinone-based acenes; compounds comprising carbon centered radical cations; compounds comprising tertiary amine centered radicals; as well as doped variants of all of them.

As mentioned above, the approach of an autophotorechargeable battery combines charge storage and photoabsorption in the same electrode material, preferably the negative electrode, thus creating a two electrode setup without the need for external voltage supply for the charge storage, i.e. electron storage or hole storage, occurring in the battery electrodes. The fast spatial separation of electrons and holes is necessary to prevent charge recombination and thus a self-discharge of the system. A hole transport material located in between hole storage material and valence band of the electron storage material may prevent these recombination pathways.

As discussed above, the HTM may also act as a HSM. This may be the case when a conductive polymer as defined in the first aspect of the present invention is used as the HSM. It is also possible to use different materials for the HSM and HTM, respectively. In this case, a layer of a HTM is sandwiched between the electron storage material and the HSM.

General requirements for both, HTM and HSM, include a suitable band alignment, namely the valence bands of HTM and HSM have to be positioned above the valence band of the carbon nitride (see FIG. 19). Furthermore, these materials are required to possess good charge transfer kinetics between both junctions to the active material and HSM in case of HTM, or HTM and the substrate acting as counter electrode in case of HSM. Optimizing charge transfer is significant to improve cell voltage. On the one hand, a large driving force increases charge transfer probability and thus quantum efficiency from a thermodynamic point of view. On the other hand, it also decreases the overall cell voltage. This means that there is a trade-off between high cell voltage and quantum efficiency. During photon absorption, excitons are generated in both surface and bulk material. However, excitons from the bulk have to diffuse to the junction of the HTM to participate in the solar battery charging process. Electron and hole recombination along this way may decrease efficiency of the active material significantly.

After photoexcitation of electrons into the conduction band, holes are left behind. Both are forming so-called excitons (electron hole pairs). These free charge carriers are held together by coulombic interactions, described as the exciton binding energy. A spatial separation of the charge carriers can prevent their recombination. Hole transport materials (HTM) are utilized for the task of charge separation and will be discussed in the following. The most important criterion of choosing appropriate hole transport- and storage materials is their electronic structure. By nature, electrons tend to move towards the energetically lowest unoccupied energy level and holes behave in exactly the opposite way. The energy level on which hole conduction takes place in such a HTM should be located in between valence bands of the hole donor, i.e. the electron storage material, and the hole acceptor, i.e. the hole storage material.

The electrolyte in the autophotorechargeable battery is preferably an aqueous medium. The electrolyte in the autophotorechargeable battery may be a liquid electrolyte comprising a redox shuttle, wherein the electron storage material and the hole storage material are both in contact with the liquid electrolyte. A redox shuttle within the meaning of the present invention refers to an electrochemically reversible moiety, which, during charging of the electrochemical device, acts as a hole transport medium. The electrochemically reversible moiety is preferably an earth abundant redox couple, such as iodine/triiodide ($I^-$, $I_3^-$).

An electron transport material may be provided between the nitrogen-containing electron storage material and the substrate of the negative electrode. The electron transport material enhances the charge extraction from the storage material to the substrate. An electron transport material may prevent holes created during photoexcitation of electrons in the electron storage material from recombining with electrons on the substrate of the negative electrode. Thus, the electron transport material can prevent charge recombination, and thus increase the charge storage ability of the photorechargeable battery. The electron transport material may be titanium dioxide. Furthermore, the electron transport materials listed in Tables 3 a) and b) may be used in the present invention.

TABLE 3a

Electron Transport Materials

| Material | | | | Optical | |
|---|---|---|---|---|---|
| Class | Derivatives | Reference/doi | Application | Bandgap | Potentials |
| Terephthalate centered charge storage | As functional group on Polythiophene or PEDOT | 10.1016/j.electacta.2016.10.183 | ESM/ETM (HTM/HSM) | 2.5 eV | −2.2 V vs Fc/Fc+ −0.9-0.1 V vs Fc/Fc+ |
| Fullerenes | PCBM | | | 2 eV | |
| Oxides | Reduced Graphene oxide | | ETM | | |
| TiO2 | | | | | |

TABLE 3b

Electron Transport Materials

| Building unit | Reference | Optical bandgap | potentials |
|---|---|---|---|
| N—N bonded nitrogen as radical center like verdazyl, hydrazyle (DPPH = Dipehnylpicrylhydrazyl) | DOI: 10.1002/pola.28042<br>DOI: 10.1039/c4py00829<br>Polym. Chem. 2014, 5, 5223-5226.<br>J. Polym. Sci., Part A: Polym. Chem. 2016, 54, 1803-1813.<br>Adv. Electron. Mater. 2016, 2, 1600253.<br>DOI: 10.1080/13510002.2017.1364330<br>https://www.electrochem.org/dl/interface/wtr/wtr05/wtr05_p32-36.pdf | 2.2-4.9 eV | 0.2-0.88 and −0.48- −1.01 vs Ag/AgCl |
| N—O bonded oxygen as radical center like nitroxyl, nitronylnitroxide | DOI: 10.1002/marc.200700300<br>DOI: 10.1039/COPY00308E<br>DOI: 10.1021/cm9504551<br>DOI: 10.1016/j.solener.2018.02.026<br>DOI: 10.1016/j.electacta.2017.03.068<br>DOI: 10.1021/ma0628578<br>DOI: 10.1002/adma.201003525<br>DOI: 10.1039/C4NJ00012A<br>DOI: 10.1016/j.electacta.2017.11.168 | 1.4-5.1 eV | 0.6-1.5 V vs Ag/AgCl and −0.6--1 V vs Ag/AgCl; VB: −5.2 eV |

TABLE 3b-continued

Electron Transport Materials

| Building unit | Reference | Optical bandgap | potentials |
|---|---|---|---|
| C—O bonded oxygen as radical center like Galvinoxyldiimide polymers, phenoxyl- and N containing containing Polymers, oxophenalenoxyldiimide | DOI: 10.1021/jp040634i<br>DOI: 10.1039/c7py02001e<br>DOI: 10.1021/cm901374u<br>DOI: 10.1002/adma.200803073<br>DOI: 10.1039/C0SC00287A<br>DOI: 10.1002/marc.201500702<br>DOI: 10.1002/marc.201300791<br>DOI: 10.1039/C5D103131A<br>DOI: 10.1038/NMA13142<br>doi: 10.1351/pac200880030507 | 0.6-3.3 eV | 0--0.8 V vs Ag/AgCl; 2.0-2.5 V vs Li; −2.3--2.4 V vs Fc/Fc+ |
| 5 rings containing one or more heteroatoms like N, S, P, Se, Te, B, . . . e.g. Imidazol, Pyrazol, Diazole, Benzothiazol, benzothiadiazole, Thienopyazine, Isoindigo | DOI: 10.1039/b915995a<br>DOI: 10.1039/c3tc32008a<br>DOI: 10.1039/c5cs00650c<br>DOI: 10.1016/S0014-3057(98)00268-7<br>DOI: 10.1016/S0379-6779(97)80827-2<br>DOI: 10.1039/c5cs00650c<br>DOI: 10.1021/acs.jpcc.8b01434<br>DOI: 10.1039/c4ra00335g<br>ISBN: 978-1-118-85874-5 | 1.7-2.9 eV | 0.2-0.7 V vs Fc/Fc+ Red: −0.2--0.7 V vs SCE Ox: 0.2-0.7 V vs SCE; Ox: 0.93-1.67 V vs Ag/AgCl red: −1.52 V vs Ag/Ag+ |
| 6 rings containing one or more heteroatoms like N, O, S, P, Se, Te, B, . . . e.g. pyidinium, Phenantroline, Xanthen dyes (e.g. rodamine), thiazine, oxazime, triazine, tetrazine, chinoxaline, phenazine, viologen, flavine, bipyridine and terpyridine complexes, biquinoline and complexes, pyrazine, Polyborazines/ borazyline, polyaminoborane | DOI: 10.1021/acsomega.7b01887<br>DOI: 10.1039/c6ta05784e<br>DOI: 10.1016/j.electacta.2014.12.116<br>DOI: 10.4236/ojic.2013.31002<br>DOI: 10.1039/c0pp00317d<br>DOI: 10.1016/j.apcatb.2018.08.005<br>DOI: 10.1002/anie.201801112<br>DOI: 10.1039/c8cc00957k<br>DOI: 10.1039/c6ta06449c<br>DOI: 10.1002/anie.201202476<br>DOI: 10.1002/app.4086<br>DOI: 10.1038/nenergy.2017.74<br>DOI: 10.1039/c7gc00849<br>DOI: 10.1039/b9nj00757a<br>DOI: 10.1039/B9NJ00757A<br>DOI: 10.1007/s11426-012-4556-3<br>DOI: 10.1002/ejoc.200600376<br>DOI: 10.1039/b408479a<br>DOI: 10.1016/j.jphotochem.2011.02.025<br>DOI 10.1007/s10965-016-0945-1<br>DOI: 10.1016/j.chempr.2017.11.001<br>DOI: 10.1039/c4dt0034<br>DOI: 10.1149/1.3652840<br>DOI: 10.1021/ja060470e<br>ISBN: 978-0-470-798-9<br>DOI: 10.1002/ejic.200900044,<br>DOI: 10.1002/ange.201607131<br>DOI: 10.1021/ja063519p | 1.3-4.0 eV | −2--0.7 V vs Fc/Fc+; 0.2-0.75 V vs Ag/AgCl and −0.2--1.7 V vs Ag/AgCl |
| Phenyl-ring amine bridged like terephthalates | DOI: 10.1016/j.jsamd.2016.08.001<br>DOI: 10.1002/anie.201607820<br>Int. J. Electrochem. Sci., 7(2012)10666-10678<br>DOI: 10.1016/j.electacta.2016.10.183 | 1.7-3.8 eV | 3.0 and 3.9 V vs. Li −2-2.2 V vs Fc/Fc+ −0.9-0.1 V vs Fc/Fc+ |
| Polycyclic aromatic carbon compounds with heteroatoms, N, O, S, P, Se, Te like imin/amin bidged pyrentetraone, imin/amin bidged quionone, imin/amin bidged phenanthrene, tetracyanoquinone, dicyanobenzoquinone, Phenyl naphthalene diimide, napthalene | DOI: 10.1021/cm00010a002<br>DOI: 10.1016/j.jtusci.2014.12.003<br>DOI: 10.1021/ja067475w<br>DOI: 10.1002/aenm.201100795<br>DOI: 10.1016/j.electacta.2015.07.163<br>DOI: 10.1021/ja206961t<br>DOI: 10.1002/aenm.201601415<br>DOI: 10.1039/c4ta01138d<br>DOI: 10.1021/acsmacrolett.8b00154<br>DOI: 10.1016/j.dyepig.2016.04.046<br>DOI: 10.1038/NMAT4919<br>DOI: 10.1002/aenm.201100795<br>DOI: 10.1039/B312349A | 0.9-4.8 eV | Red: −0.27-−1.2 eV vs. Ag/AgCl; Ox: 1.3 V vs Ag/AgCl; 1.8-2.5 eV vs Li 0.2-0.85 V vs |

TABLE 3b-continued

Electron Transport Materials

| Building unit | Reference | Optical bandgap | potentials |
|---|---|---|---|
| diimide, PBFI (tetraazabenzodifluoranthene diimide), Hexaazatriphenylene, Fullerene, reduced graphen oxide | CHEM. RES. CHINESE UNIVERSITIES 2009, 25(6), 950-956<br>DOI: 10.1039/c3cc39141<br>ISBN 978-3-642-27620-0<br>DOI: 10.1557/mrc.2017.127<br>DOI: 10.1021/acs.chemmater.5b01274<br>DOI: 10.1021/ja407471b<br>DOI: 10.1021/ma502042<br>DOI: 10.1039/c5cs00181a | | SHE −0.58 vs Fc/Fc+; −1-−2 V vs Ag/Ag+ |

In a fourth aspect, the present invention relates to an a negative electrode comprising a substrate with a surface and a layer comprising an electron storage material provided on the surface of the substrate, a positive electrode comprising a substrate with a surface, and a layer comprising a nitrogen-containing hole storage material provided on the surface of the substrate, and an electrolyte, wherein the nitrogen-containing hole storage material has a two-dimensional or a three-dimensional covalent structure, is capable of intercalating and de-intercalating cations and/or anions, and has a band gap in the range of 0.5 to 3.5 eV.

The nitrogen-containing hole storage material can absorb light to excite electrons and holes, and store the photogenerated holes.

A layer of an electron transport material may be sandwiched between the electron storage material and the hole storage material. The electron transport material is preferably a conducting material, more preferably a conducting polymer. The electron transport material is most preferably selected from the group consisting of fullerenes, terephthalate-centered materials, conductive carbon based materials, such as graphite, and oxides, such as titanium dioxide and reduced graphene oxide (see Table 3).

The layer of the nitrogen-containing electron storage material may comprise the nitrogen-containing electron storage material in an amount of at least 80 wt.-%, preferably at least 90 wt.-%, in terms of the weight of the layer.

The electrolyte is preferably a liquid electrolyte comprising a redox shuttle, wherein the electron storage material and the hole storage material are both in contact with the liquid electrolyte. The electrolyte is most preferably an aqueous medium.

A hole transport material may be provided between the nitrogen-containing hole storage material and the substrate of the positive electrode.

The nitrogen-containing hole storage material is preferably composed of heptazine and/or triazine moieties, and is more preferably a material in which carbon and nitrogen atoms alternate. The nitrogen-containing hole storage material may also be covalent organic framework. The band gap of the nitrogen-containing hole storage material is preferably in the range of 1.0 to 2.0 eV, or of 2.0 to 3.0 eV.

Redox Flow Battery

In a fifth aspect, the present invention is directed to a redox flow battery comprising an electrochemical cell comprising the electrochemical device according to the first aspect of the present invention, the photorechargeable battery according to the second aspect of the present invention, or the autophotorechargeable battery according to the third or fourth aspect of the present invention, one or more tanks containing an electrolyte solution, pipes connecting each of the tanks to the electrochemical cell, and a pump for circulating each of the electrolyte solutions between the electrochemical cell and the respective tank.

In the redox flow battery, the electrolyte solution serves as hole storage medium or electron storage medium, and preferably as hole storage medium. The electrolyte solution may contain an inorganic salt or an organic compound. The electrolyte solution contains preferably at least one electrolyte selected from the group consisting of polycyclic aromatic hydrocarbons, benzophenone, carbon nitrides, quinones, viologenes, benzenes, carbonyls, nitroxide radicals, and metallocenes. Properties and examples of these compounds are given in Table 4a) and b).

The pump circulates each of the electrolyte solutions between the (photo)electrode of the electrochemical cell and the respective storage tank, which may serve as the counter-electrode of the electrochemical cell.

Hence, the charge is not stored in a solid-state electrode, but within a charged electrolyte acting as the charge storage medium, which is stored in a tank and connected to the cell via different pipes. To ensure good electrolyte flow, a pump is connected to the respective tank. The electrolyte solution is circulated between the tank and the electrochemical cell, thereby getting in contact with the electrodes of the electrochemical cell. Preferably, charge extraction from the storage electrolyte is realized in the tank.

The redox flow preferably contains one tank.

TABLE 4a

Electrolytes for Redox-Flow Cell

| Class | Material Example | Reference/doi | Application | Optical Bandgap | Potentials |
|---|---|---|---|---|---|
| polycyclic aromatic hydrocarbons | | 10.1039/C8TA03221A | | | |
| Benzophenone | | 10.1016/j.ijhydene.2017.03.034 | | | Approx. −2.2 V vs Ag/AgCl |
| Carbon Nitrides | NCN-PHI etc. | | | | |
| Quinones | anthraquinones | 10.1021/acs.jpcc.8b04914 | | | −0.5−+0.2 V vs NHE |
| | DBEAQ | 10.1016/j.joule.2018.07.005 | | | Approx. −0.5 V vs SHE |
| Viologens | methyl viologen | 10.1038/nature15746 | | | |

TABLE 4b

Electrolytes as hole storage medium for a Redox-Flow Cell

| Class | Material Example | Reference/doi | Application | Potentials |
|---|---|---|---|---|
| Quinones | 2,6-DHAQ | 10.1126/science.aab3033 | ESM for alkaline Redox Flow Battery | −0.65 V vs SHE |
| | Chloranil | 10.1016/j.elecom.2009.05.021 | ESM | $E^0 = 0.71$ V |
| Benzenes | Dialkoxybenzenes (BODMA/BODEA) | 10.1002/aenm.201701272 | Catholyte | BODMA: +4.02 V vs Li BODEA: +4.18 V vs Li |
| Carbonyls Nitroxide Radicals | TEMPO 4-HO-TEMPO | 10.1002/aenm.201501449 | HSEI | approx. 0.8 vs NHE |
| Viologenes | N,N'-dimethyl-4,4-bipyridinium dichloride (MV) | 10.1002/anie.201606472 | | −0.63 V vs Ag/AgCl |
| Metallocenes | BTMAP-Fc | 10.1021/acsenergylett.7b00019 | HSEI | +0.39 V vs SHE |
| | BTMAP-Vi | 10.1021/acsenergylett.7b00019 | HSEI | −0.358 V vs SHE |
| | FcN FcNCl | 10.1021/jacs.6b10984 | | +0.4 V vs NHE +0.61 V vs NHE |

Methods for Harvesting Light and Storing Electrical Energy

According to the sixth aspect, the present invention relates to a method for harvesting light and storing electrical energy, the method including the steps of providing an electrochemical device comprising a negative electrode comprising a substrate with a surface and a layer comprising a nitrogen-containing electron storage material provided on the surface of the substrate, and illuminating the nitrogen-containing electron storage material with sunlight, wherein the nitrogen-containing electron storage material has a two-dimensional or a three-dimensional covalent structure and is capable of intercalating and de-intercalating cations, and wherein light harvesting occurs within the nitrogen-containing electron storage material during the step of illuminating the nitrogen-containing electron storage material and electron storage occurs within the nitrogen-containing electron storage material during and after the step of illuminating the electron storage material.

In the step of illuminating the nitrogen-containing electron storage material with sunlight, electrical energy storage occurs solely due to illumination and it is not necessary to apply a voltage to the electrodes.

Electron storage occurs within the nitrogen-containing electron storage material during the step of illuminating the nitrogen-containing electron storage material and the electrons remain stored after illumination is stopped.

The electrochemical device use in the method according to the sixth aspect of the present invention is preferably the electrochemical device according to the first aspect of the present invention, the photorechargeable battery according to the second aspect of the present invention, or the autophotorechargeable battery according to the third aspect of the present invention. The nitrogen-containing electron storage material used in the method has preferably a band gap of 0.5 to 3.5 eV. More preferably, the nitrogen-containing electron storage material used in the method contains heptazine and/or triazine moieties, and most preferably is a material in which carbon and nitrogen atoms alternate.

According to the seventh aspect, the present invention relates to a method for harvesting light and storing electrical energy, the method including the steps of, providing an electrochemical device comprising a positive electrode comprising a substrate with a surface and a layer comprising a nitrogen-containing hole storage material provided on the surface of the substrate, and illuminating the nitrogen-containing hole storage material with sunlight, wherein the nitrogen-containing hole storage material has a two-dimensional or a three-dimensional covalent structure and is capable of intercalating and de-intercalating cations and/or anions, and wherein light harvesting and hole storage occurs within the nitrogen-containing hole storage material during the step of illuminating the nitrogen-containing hole storage material.

Hole storage occurs within the nitrogen-containing hole storage material during the step of illuminating the nitrogen-containing hole storage material and the holes remain stored after illumination is stopped.

The electrochemical device used in the method according to the seventh aspect of the present invention is preferably the autophotorechargeable battery according to the fourth aspect of the present invention.

The nitrogen-containing hole storage material preferably contains heptazine and/or triazine moieties. The nitrogen-containing hole storage material may also be a material in which carbon and nitrogen atoms alternate. The band gap of the nitrogen-containing hole storage material used in the method according to the seventh aspect has preferably a band gap of 0.5 to 3.5 eV.

Method for Detecting Oxygen

In an eighth aspect, the present invention is directed to a method for detecting or removing oxygen, the method including the steps of, providing an electrochemical device according to the first aspect of the present invention, charging the nitrogen-containing electron storage material with electrons, bringing the nitrogen-containing electron storage material in the charged state in contact with a test fluid or gas, and analyzing the state of the layer of the nitrogen-containing electron storage material by visual detection or by measuring the change of the electrical potential of the device before, during and/or after bringing it in contact with the test fluid or gas.

In this method, the step of charging the nitrogen-containing electron storage material is carried out by applying a voltage between the electrodes or by illumination, optionally in an oxygen free medium with respect to the nitrogen-containing electron storage material. In order to ensure complete removal of the oxygen in the test fluid or gas, charging may also take place after bringing the nitrogen-containing electron storage material in contact with the test fluid or gas.

Method for Detecting Light

In the ninth aspect, the present invention is directed to a method for detecting light, the method including the steps of, providing an electrochemical device according to the first aspect of the present invention, illuminating the layer of the nitrogen-containing electron storage material, detecting the state of the nitrogen-containing electron storage material by optical means or by measuring the electrical potential between the electrodes.

The illumination occurs preferably with visible light, i.e. light having a wavelength in the range of 380 to 700 nm, and more preferably with light having a wavelength that contains spectral parts with energies above the band gap of the nitrogen-containing electron storage material (450 nm for NCN-PHI).

Use of the Electrochemical Device

In the last aspect, the present invention is directed to various uses of the electrochemical device according to the first aspect of the present invention.

More particularly, the electrochemical device according to the first aspect of the present invention may be used in or as a photorechargeable battery, in or as an autophotorechargeable battery, in or as a redox-flow-battery, in or as an oxygen detector, or in or as a light detector.

EXAMPLES

Preparation of NCN-PHI Electrode

NCN-PHI Synthesis

All chemicals used are reagent grade purity. Potassium containing NCN-PHI was prepared from melon and KSCN following the published procedures described in V. W. H. Lau et al., *Nature Communications*, 2016, 7, 12165, and V. W. Lau, et al., *Angewandte Chemie International Edition*, 2017, 56, 510-514, in particular following the synthesis procedures described in methods section in V. W. H. Lau et al., *Nature Communications*, 2016, 7, 12165.

NCN-PHI Ion Exchange for CV Control Experiments

For the ion exchange with $Li^+$ ions potassium containing NCN-PHI (200 mg) was dispersed in a LiCl solution (1 M, 20 ml). To avoid protonation, LiOH solution (1 M,) was added until a pH of 9-10. After several hours of stirring the product was separated from the solution by centrifugation and multiple washing with water until a neutral washing solution was obtained. This procedure (i.e. stirring in LiCl solution with a pH of 9-10 and washing of the product) was repeated two more times. The final yellow solid was dried at 60° C. in vacuum overnight.

Preparation of the Electrode

Nanosheets of NCN-PHI were obtained by sonicating the pristine powder in deionized water for 2 h. The sheets were separated from the bulk material by two centrifugation steps (353 RCF, 25 min and 795 RCF, 40 min) in a Sigma 3-30k centrifuge. Subsequently, the nanosheet supernatant was separated by centrifugation for 90 min (35329 RCF), yielding dense dispersions in the range of 1-5 mg/ml.

Electrode substrates were prepared by contacting Sigma Aldrich FTO slides (surface resistivity: 7 Ohm/sq), cut to 5×7 mm, to isolated copper wires with silver paste. The contact was sealed with epoxy (3 M Scotch-Weld DP410), leaving an exposed electrode area of approximately 5×5 mm². After plasma cleaning, an equivalent of the nanosheet suspension, usually 10 µg of NCN-PHI, was drop cast on the electrodes and dried on a hot plate at 60° C. for at least 2 h. For spin-coated electrodes, 25 µg of material was used for every spin coating step (ramp: 1200 rpm/s; 60 s spin coating; 10 min drying at 60° C. in-between the steps; rotation frequency and amount of steps depends on sample and is described in the respective figures). The mass loading of spin-coated electrodes could not be determined due to the low specific weight of NCN-PHI with respect to the electrode (<20 µg) and the roughness of the substrate, which is beneficial for adhesion but disadvantageous for thickness or volume determination. The mass was therefore determined from the drop-casted samples by calculation of the used sample concentration and by using a quartz microbalance (Sartorius ME36S).

Preparation of Cell

Thin Film Preparation

One of the main challenge is creating uniform thin films of the respective materials. Especially for multi-layered systems, optimizing deposition techniques should receive special attention to minimize possible pinholes and subsequent short-circuits. Thin films were deposited on fluorine doped tin oxide substrates (FTO, Sigma Aldrich). FTO was cut into 7×5 mm pieces. The small size was chosen so that the sample could fit into the electrochemical measurement cell. Furthermore, small substrates are beneficial for the sandwich configuration of some samples, as it allows a more homogeneous pressure application despite a rough film surface. Before deposition, the substrate FTO was treated in an oxygen plasma (Femto, Diener Electronic GmbH & Co. KG Plasma-Surface-Technology) for 2 minutes to activate the surface and make it more hydrophilic. This step was necessary to ensure a homogeneous surface wetting of the substrate with the respective deposition suspension.

Drop Casting

Drop casting was chosen due to the small amount of waste generated and the fast timescale. Each FTO substrate was treated with oxygen plasma for 2 minutes and placed on a hot plate (C-MAG HS7, IKA-Werke GmbH & Co. Kg) or in the fridge with the desired drying temperature. Next, 10 µL of the respective suspension was drop cast onto the sample. To ensure a homogeneous surface wetting, the solution was applied on the edges first and allowed to flow into the center with a slow velocity. The sample was subsequently dried for at least 2 hours at different temperatures on a hot plate. Sheets were contacted after deposition, as attractive forces between the suspension and epoxy disturbed the formation of homogeneous films. For full-cell experiments performed with more than two materials (e.g., NCN-PHI together with a HTM and HSM material), it was necessary to drop cast the HTM onto a NCN-PHI coated FTO substrate. Plasma cleaning was only carried out for the first deposition of NCN-PHI to prevent destruction of the films. For samples used in half-cell experiments, it was important that no FTO was in contact with the electrolyte. Therefore, non-coated parts were sealed with epoxy after drop casting.

Spin Coating

Similar to drop casting, the surface of FTO sheets was activated by exposing it for 2 minutes to an oxygen plasma. The substrate was then put into the spin coater, 10 µL of the respective suspension was added on top of it and the spin coater (WS-650MZ-23NPP, Laurell Technology Corporation) was started. Spinning duration and speed was optimized for each substance. For NCN-PHI samples several subsequent spin coating steps were necessary due to the very weak interaction forces to FTO and the material itself. After each spin coating step, the sample was dried for at least 2 hours on a hot plate at 60° C.

Contacting FTO Substrates

To create an electrical connection between potentiostat and FTO sheets on which the respective films were deposited, wires had to be contacted to the FTO substrate and sealed. Depending on sample, contacting was performed before or after thin film deposition (pre- and post contacting, respectively). Note that for samples contacted after deposition, it was necessary to scratch off around 2 mm of the film with a wet toothpick to allow contacting the bare substrate. Subsequently, silver conductive glue (RS PRO, RS 186-3600) was applied both on the substrate and a stripped off copper cable and the two parts were joined. As silver is electrochemically active, the joint was sealed with epoxy glue (3M Scotch-Weld, DP410). The sample was then dried overnight at ambient temperature or in an oven at 60° C. for at least 2 h.

Sandwich Configuration

Two different approaches were chosen for full cell samples: In the first approach, thin films were deposited onto a FTO sheet and the substrate was contacted according to procedures described above. Subsequently, Au was sputtered on the sample to act as a cathode. The Au film was contacted via a second copper and glued together with conductive silver glue. This approach is very sensitive for short circuits, if an incomplete coating of the FTO sheet is not avoided. A second approach was applied: Two, with a respective material coated FTO sheets were placed on top of each other and pressed down with a weight. Epoxy glue was applied on both sides to stabilize the sample and allowed to dry overnight.

Methods of Measurement

Photoelectrochemical Measurements

Photoelectrochemical measurements were performed in a self-made closed glass reactor equipped with a quartz window for side illumination. 1 M Na-based phosphate buffer solution (containing $NaH_2PO_4$ (57.2 g, 0.48 mol) and $Na_2HPO_4$ (74.2 g, 0.52 mol) in water (1 l)) at pH=7 or aqueous KCl solution (1 M) were used as electrolyte. An Ag/AgCl reference electrode with saturated KCl (+0.197 V vs. NHE) was used as reference electrode and a glassy carbon rod as counter electrode. The electrolyte was purged with >99% pure $N_2$ or Ar prior to every measurement through a porous glass frit to remove dissolved oxygen. The dissolved oxygen content was monitored to be <10 ppb with a Presens Fibox 3 Trace optic oxygen meter together with a PSt6 sensor spot being placed on the inside of the reactor. Electrochemical measurements were recorded and analyzed using an Ivium CompactStat potentiostat and the IviumSoft software. Simulated sunlight was provided by a Sciencetech LightLine A4 solar simulator (class AAA) fitting the ASTM standard G138 (AM 1.5G). The intensity of the illumination was measured by a calibrated Thorlabs S310C thermal power meter and further confirmed by a calibrated Ocean Optics USB4000 spectrometer.

To analyze electrochemical parameters of half-cell electrodes, they were also measured independently against an Au counter electrode in the above-mentioned self-made closed glass reactor. Au electrodes were manufactured by contacting Au foil with an insulated copper wire with conductive silver glue, inserting the wire into a glass tube and sealing the connection and tube exit with epoxy glue. To reference the applied potential of the system on an electrochemical scale, it was controlled by the potentiostat via an Ag/AgCl reference electrode (+0.197 vs. NHE) with saturated KCl. During each measurement, the system was purged with argon gas to ensure no oxygen was left in the electrolyte. The reactor was placed in a dark chamber and wrapped in aluminum foil to create a simple Faraday cage.

To measure a full-cell, a two electrode setup was used. Due to the specific geometry of this system, no reference electrode is required and only the potential between both electrodes is measured. The same glass reactor, which was used for half-cell experiments, was used. Experiments were performed in the dark chamber. Full-cell experiments were either performed in dry conditions in an argon stream or in water purged with argon to prevent drying of the sample. Argon was purged in both cases to remove oxygen.

Hydrogen Evolution in Phosphate Buffer and 4-MBA

The photocatalytic experiments were performed in a glass photoreactor with a quartz window on the top. The whole reactor was thermostated at 25° C. All glassware used for the experiments were soaked overnight in aqua regia for cleaning. A standard experiment for hydrogen evolution involved irradiating the reactor under AM 1.5G conditions. As a light source a xenon lamp (Newport, 300 W) equipped with a water filter and a full spectrum mirror (2000 nm>$\lambda$>200 nm) was used. The headspace of the photoreactor was evacuated and backfilled with argon several times prior to the experiment in order to provide an oxygen free environment. During illumination, the headspace of the reactor was periodically sampled and the components were quantified by gas chromatography (Thermo Scientific TRACE GC Ultra, equipped with a TCD detector) using argon as carrier gas.

IR

ATR-IR spectra were collected with a PerkinElmer UATR TWO spectrometer equipped with a diamond crystal. Characterization of NCN-PHI nanosheets by IR showed no changes in the structure of the samples being measured either immediately, after drying of a fresh and a 3 week old nanosheet suspension, respectively.

ICP-OES

ICP measurements were performed on the powder before sonication and on the dried sheet dispersions to determine the amount of potassium which is present in the structure. The bulk NCN-PHI powder contained 9.55 wt % K while the sheets have a slightly higher K content of 10.22 wt %, corresponding to a relative amount of 0.55 (0.60) potassium atoms per heptazine unit (assumed molecular mass of the heptazine unit of approximately 208.7 g/mol), resulting in an overall average molecular mass of 231 (2) g/mol per potassium containing heptazine unit. The charge of the potassium ions is most likely balanced by deprotonated imide-bridges between the heptazine units and the NCN functional groups.

TEM Characterization

Transmission electron microscopy (TEM) was performed with a Philips CM30 ST (300 kV, LaB$_6$ cathode). The samples were suspended in water and drop-cast onto a lacey carbon film (Plano). The TEM images show highly crystalline flakes with a lateral size of 30-60 nm, with a characteristic spacing of approximately 3.0 Å corresponding to the XRD stacking peak and 11 Å corresponding to the in-plane pore-to-pore distance. Note that a slight contraction of the pores is induced by the electron beam exposure.

Optical Band Gap

The optical band gap of dried NCN-PHI nanosheets was determined using an Agilent Cary 5000 UV-Vis spectrophotometer. The absorbance was determined in analogy to the measurements reported in in V. W. H. Lau et al., *Nature Communications,* 2016, 7, 12165, and V. W. Lau, et al., *Angewandte Chemie International Edition,* 2017, 56, 510-514.

Zeta Potential

Zeta potential was measured on a Malvern Zetasizer Nano ZS. The NCN-PHI sample was suspended at concentration of 1.0 mg/ml. The measurements were intended to estimate the surface charge and thus a hydrodynamic radius of the dispersed nanosheets. The yellow ground state as well as the blue, excited state in the presence of 4-MBA after illumination were investigated.

Analysis of Key Properties of the NCN-PHI Electrode

In order to mimic a cathode (negative electrode) that swiftly takes up the holes, we therefore extract them chemically by a sacrificial electron donor. Aqueous 4-methylbenzyl alcohol (4-MBA) is used as a reducing agent that acts both as a highly efficient and selective hole quencher. In the first part, we evaluate key properties of the NCN-PHI solar battery anode (negative electrode) open circuit potential, charge storage capacity, and the stability of the stored charges, i.e. the storage time. We then analyze the microscopic processes and limitations underlying the observed photoelectrochemical performance.

Open Circuit Potential and Maximum Voltage

When the NCN-PHI-photoelectrodes are illuminated with AM1.5 G solar radiation in $O_2$-free 1M Na-based phosphate buffer solution (pH7) in the presence of 4-MBA, the photocharge or open circuit potential (OCP) rises up to −800 mV vs. Ag/AgCl (−600 mV vs. NHE, +2.45 V vs. Li), see FIG. 15a. We can thus distinguish between this charged, blue state and a ground or decayed state with an OCP around −200 mV vs. Ag/AgCl. This photovoltage in the charged state represents the average potential of the highest energy levels occupied by the electrons, thus defining the half-cell voltage of this solar battery anode.

Charge Storage and Extraction Characteristics

Next, we analyze the capacity of the photoanode by determining its charge storage properties. The resulting (solar) battery properties of our NCN-PHI photo-electrodes are summarized in FIG. 13. In order to estimate the maximum charge that can be extracted from the solar battery anode, we varied the discharge currents after 1 min of 1 sun illumination (AM 1.5 G) in 1 M phosphate buffer and 5 mM 4-MBA in order to find optimized charge extraction currents, see FIG. 13a. Current densities between 10 and 100 mA/g balance losses due to slow self-discharge at low currents (1 mA/g) and high intrinsic resistive losses due to limited conductivity at high discharge currents (1 A/g). The optimum was found at 100 mA/g and was used for all further measurements.

To investigate the evolution of the stored charge and its stability, we increased the illumination time stepwise and measured the respective discharge curves shown in FIG. 13b. Increasing illumination and thus charging times lead to an increase in charge storage up to 43.7 C/g (12.1 mAh/g) after 100 min of illumination. Longer illumination times above 12 h affect the electrode stability. Assuming an average mass of 231 (2) g/mol per NCN-functionalized heptazine unit, 43.7 C/g correspond to one electron being stored on every $9^{th}$-$10^{th}$ heptazine moiety. The average mass is obtained by assuming a cyanamide functionalization at every second heptazine, and 0.58 potassium ions per functionalized heptazine units and deprotonated NH bridges, resulting in an overall neutral molecule. Note that the conjugation length of the imide-bridged polymer, which varies with the synthesis conditions, influences the amount of negative charge that can be trapped on the heptazine rings as well as its delocalization across the polymer backbone and, hence, its capacity profile. The fact that the extractable charge increases non-linearly with illumination time (partly due to losses via the substrate as discussed further below, see FIG. 13c) is beneficial to charge a solar battery continuously. This situation is in contrast to solar supercapacitors that attain their capacity limit within minutes and comparable to other solar batteries that are charged by a photoelement.

To investigate for how long and efficiently this stored charge can be used after the illumination has stopped, we delayed the discharge after 10 and 30 min of illumination by 10 and 30 min, respectively, as shown in FIG. 13c. Delaying the discharge by 10 min leads to a slightly decreased capacity of only 16%, while in the 30 min case, 37% are lost. This charge decay is related to faradaic charge transfer from the partially uncovered FTO substrate to the electrolyte.

The increased charge storage in the NCN-PHI correlates with the electrode potential, which becomes more negative with irradiation time, as shown in FIG. 13d. The variable electrode potential and the amount of charge stored at each respective potential reflects the distribution of energy levels which are accessible to the photoinduced electrons, and is therefore an indirect measure of the electronic density of state (DOS), which formally translates into a differential capacitance. An analysis of the differential charge extracted after reaching the respective potentials thus allows us to estimate a differential capacitance (C=Q/V or dQ/dV) in the respective potential windows. Note that due to the faradaic losses the differential capacitance values we extract are likely underestimated. Increasing the illumination time from 10 min to 30 min leads to a voltage difference of 8 mV (−785 to −793 mV vs. Ag/AgCl) and a difference in extracted charge of 7.4 C/g. From this, a specific differential capacitance of 925 F/g can be extracted at an average intermediate potential of 789 mV, which is higher than e.g. 379.9 F/g obtained from g-C3N4@graphene oxide at similar current densities of 250 mA/g. Following the trend shown in FIG. 13d, we expect even higher specific capacities if the photovoltage is increased even more, thus again highlighting the promise of NCN-PHI as a high-capacity solar battery photoanode. Note, however, that an evaluation of the differential capacitance after longer illumination times was hindered by electrode stability issues that could lead to an overestimation of the capacitance. The long stability of the NCN-PHI discharge potential above −700 mV vs. Ag/AgCl is due to the high DOS in this voltage region. Opposite to the fast voltage decay observed in common photo-capacitors, which do not have a built-in storage option in the absorber and use separated capacitors,[8, 14] this high DOS and capacitance in our material is a key property for a stable operation potential of a solar battery. For illumination times of only 1 min, the capacity of 13.2 C/g for our NCN-PHI photoanode is comparable to photo-capacitors based on carbon-nanotubes (CNT) with a capacitance of 17.5 C/g. However, such CNT devices must be discharged within 2 min immediately after illumination due to fast self-discharge, a drawback that is circumvented by the long-term storage capacity of our material. As the potentials for electron storage are mostly more negative than −700 mV vs. Ag/AgCl in phosphate buffer and even below −800 mV in KCl (corresponding to −100 mV and −200 mV vs. RHE at pH7), the long-term stability of the charge storage on NCN-PHI is remarkable. Note that since NCN-PHI is unable to evolve hydrogen without the presence of a co-catalyst, this high overpotential for the hydrogen evolution reaction (HER) is thus a beneficial factor to increase the potential window of a solar battery anode operating in water.

An interesting aspect in terms of charge storage properties is the question whether NCN-PHI can also be charged purely electrically, i.e. by application of a negative bias and without the presence of a sacrificial donor in the dark. We therefore cycled NCN-PHI electrodes electrically in the dark in 1 M phosphate buffer to investigate the battery charging and discharging properties at 100 mA/g as shown in FIG. 14. We find that reversible electrical charging and discharging is indeed possible. The charge required to reach a potential of −800 mV vs. Ag/AgCl is slightly higher than the charge that can be extracted subsequently which is attributed to partial charge transfer to the electrolyte from uncovered substrate parts. The specific charge extracted on the discharge (45-60 C/g) is in good agreement with measurements after light charging up to almost −800 mV vs. Ag/AgCl (see. FIG. 13d) although the electrical measurement underestimates the full capacity. While a complete charging of the electrode material is possible by sunlight in the presence of a donor, purely electrical charging is limited by slow kinetics and low conductivity of the NCN-PHI films, giving rise to a potential drop across the material. It therefore does not allow charging the electrode homogenously in a short period of time and thus underestimates the capacity of the whole material.

FIGS. 14a and b further show a decrease in capacity with increasing cycle number, which is attributed to a lack in mechanical stability of the sample. To decouple the mechanical stability from the charge-discharge stability, we assume that the charge extracted at the discharge correlates with the mechanical stability (i.e. the left-over material), while the evolution of the ratio between charge stored and charge extracted (coulombic efficiency) provides a good measure for the electronic charge-discharge stability. As visible in the inset of FIG. 14b, the evolution of this coulombic efficiency quickly approaches a constant value of 75-80% with increasing cycle number, indicating continuously good electronic stability of the NCN-PHI nanosheets after some initial charging cycles that activate the material. This highlights that the lifetime limitations are most probably purely mechanical, i.e. limited by adhesion. The observed coulombic efficiencies are even above the value of 45% observed in melon-type carbon nitride (dark) battery anodes.

The FTO/NCN-PHI/Electrolyte Interface: Microscopic Insights.

For a better understanding of the microscopic processes that both enable and limit solar and electrical energy storage in NCN-PHI, further photoelectrochemical experiments have been performed. First, we address the accessible OCP under different conditions. If the NCN-PHI electrodes are illuminated without a dedicated donor in pure water or phosphate buffer, an OCP of −170 mV and −570 mV vs. Ag/AgCl, respectively, is observed, which is caused by the presence of some photo-electrons in the conduction band (see FIG. 15a). These OCP values can thus be attributed to the electron quasi-Fermi-level under 1 sun illumination and is due to a balance between charge generation and recombination. The higher OCP in the phosphate buffer case is attributed to a small capacitive stabilization of the photoelectrons that will be discussed in more detail below. When the donor 4-MBA is added, the OCP value is again −800 mV vs. Ag/AgCl, thus 200 mV more negative than in the case with only phosphate buffer: Since now the holes are quenched and electrons can accumulate, they reach more negative states. Furthermore, the charging process continues if both donor and phosphate buffer are present, which leads to a gradual increase in the OCP as well as a more stable electrode potential after illumination, i.e. a delayed decrease in potential after the light is switched off. This phenomenon points again to a capacitive storage of electrons in the potential window more negative than −600 mV vs. Ag/AgCl, as discussed further below.

To investigate the amount of charges per second that are effectively generated and stored in NCN-PHI upon illumination, i.e. the electron generation currents, we measured the photocurrents at different potentials vs. Ag/AgCl applied to the NCN-PHI@FTO electrodes in the presence and absence of a donor, see FIG. 15b. A negative current corresponds to electron injection through the FTO substrate into the NCN-PHI or into the electrolyte, while a positive current is a measure for photoelectrons withdrawn from the material (i.e. the desired process). Without any illumination, an applied voltage of −200 mV vs. Ag/AgCl corresponds to dark OCP conditions and no current flow is observed for all cases. Under illumination and in the presence of a donor, the application of a bias of +600 mV (i.e. a working potential at −200 mV vs. Ag/AgCl) creates an extraction driving force with respect to the electrons being present in the conduction band and leads immediately to a positive charge extraction current. It is an order of magnitude higher than without 4-MBA (FIG. 15b). This highlights the importance of an efficient hole extraction to charge the electrode efficiently and to stabilize the charges in low voltage states. With an increasing negative voltage that is applied as indicated in FIG. 15b, the driving force for hole extraction decreases and so does the current until the applied voltage is −800 mV vs. Ag/AgCl. The small positive current even without a dedicated donor (red curve) highlights that a kinetically hindered oxidation of the phosphate buffer or water is possible, which is consistent with the valence band lying well below the required potentials for these reactions. In other words, water can also act as a donor for NCN-PHI, but is less efficient than 4-MBA. Without donor, we already observe a negative current at −600 mV vs. Ag/AgCl, arising from electron injection into the conduction band of the material as the applied potential is more negative than the OCP under illumination. In the same voltage region (<−600 mV), the FTO substrate shows a small negative current due to redox-reactions with the electrolyte (water reduction or phosphate reduction[17]). From this we can deduce that the charging currents for NCN-PHI electrodes in this potential range are limited by self-discharge involving electrons being injected back through the substrate into the electrolyte. Although this process is by orders of magnitude smaller compared to the charging currents with a donor present, it nevertheless presents a loss channel explaining the discrepancy between the direct and delayed discharging processes shown in FIG. 13c. Hence, a complete coverage of the substrate with NCN-PHI is crucial to achieve a stable OCP after illumination, which remains to be optimized.

Pseudocapacitance and Charge Carrier Kinetics.

To further study the role of ions for the energy storage process and its kinetics, we cycled the electrodes electrochemically in the dark. FIG. 15c shows the current-voltage (CV) measurements of NCN-PHI@FTO electrodes in 1 M KCl in different potential windows. KCl was chosen instead of phosphate buffer due to the better electrochemical stability of the electrolyte (no reaction with phosphates possible) and the improved cycling stability of the electrodes. The blue curve (−300 mV to −1000 mV vs. Ag/AgCl) shows that a significant current flows into the electrode starting from −600 mV vs. Ag/AgCl, first with a flatter slope, then with an increasing slope from −800 mV on. The shape of the curves suggest that (i) the charge transfer is capacitive in nature and (ii) the charge uptake by the NCN-PHI electrode and, hence, also the charge extracted from NCN-PHI, is dependent on the absolute potential window. This further proves different capacitive regimes for electron uptake, corresponding to a potential-dependent DOS in the conduction band that is increasing with negative potential, in agreement with FIG. 13d. The presence of kinetic limitations of this charge storage and release process are best visible in the blue scan in FIGS. 15c and d. It requires a whole scan back to −300 mV and forward to −600 mV to release all the charges stored in the conduction band below −600 mV vs. Ag/AgCl before a refilling of the NCN-PHI at more negative potentials starts again (FIGS. 15c and d). This behavior puts a limit to the discharge kinetics, indicating that a fast discharge is not able to extract all the electrons in the CB, as previously observed in FIG. 13a and the galvanostatic charge and discharge experiments in FIG. 14. Possible causes for this effect are an increase in electronic conductivity if the CB is gradually filled, similar to $TiO_2$, which is discussed in the section Charge transfer properties, or a kinetically limited pseudo-capacitance that enhances charge transport and stabilizes the negative charge on the material by the in-diffusion and adsorption of alkali-metal-ions, i.e. a diffusion-limited mass transport process, or both. In fact, scan-rate dependent measurements in the region between −700 and −900 mV vs. Ag/AgCl show linearly increasing positive peak currents that follow pseudocapactive behavior rather than a double layer capacitance which should follow a square root dependency. This is an indirect proof of the stabilization of the negative charge (i.e. "trapped electrons") by alkali metal ion adsorption. This screening of the negative charge is also the reason for the observed increased OCP without donor in the case of phosphate buffer vs. pure water (FIG. 15a), pink vs. red curve. Control CV experiments without alkali metal ions present in the solution have been performed with 1M tetrabutylammonium chloride (TBA-Cl) and did not show any positive currents, indicating that TBA cations are unable to support charge storage in this material. This clearly highlights the importance of an appropriate cation size (or more specifically, its hydrodynamic or equivalent Stokes radius) in order to penetrate the structural pores of NCN-PHI (3.8 (4) Å) and thus to stabilize the electron storage by a pseudocapacitive process. Solvated TBA ions (4.95 Å) seem to be too large to penetrate the pores, while $Na^+$ (1.84 Å) and $K^+$ (1.25 Å) both fit inside the pores, thus enabling pseudo-capacitive charge stabilization.

Charge transfer properties. To further investigate the influence of illumination on the role of the counter ions as well as the mobility of charge carriers in NCN-PHI electrodes, we performed impedance measurements in the ground state voltage region (−24 mV vs. Ag/AgCl) and in the charged or "activated" region (−850 mV vs. Ag/AgCl), in KCl, again due to a more pronounced capacitive response, see FIGS. 16a and b. The data is fitted by an equivalent circuit diagram which can be deduced from generalized equivalent circuits, see inset FIG. 16a. It accounts for series resistance losses in the contact and the electrolyte, and includes a constant phase element accounting for double layer capacitance $Q_{DL}$ in parallel to a charge transfer resistance as well as a constant phase element accounting for pseudocapacitance $Q_P$ in parallel to a resistive element RC, accounting for the materials' conductivity. The measurement under illumination (blue curve) shows a significantly lower charge transfer resistance (i.e. better conductivity) with respect to the one measured in the dark (black curve). The appearance of an additional semicircle at higher frequencies is due to changes in the respective capacitive and conductive parameters. The dominant contribution to the capacitance shifts from double layer capacitance (5.9 F/g, dark measurement) to pseudocapacitance (blue curve, illuminated) and becomes as high as high as 191 F/g. The increasing value with respect to CV measurements beforehand is due to more homogeneous charging as discussed above and in the following graph, and is approaching the differential capacitance values extracted from the measurements under illumination in FIG. 13d.

The apparent increase in conductivity that is observed in the blue state can be due to either increased electronic or ionic conductivity in the (light) charged state in an aqueous environment. To distinguish between both effects, the purely light-dependent conductivity was determined by sandwiching NCN-PHI between two FTO electrodes and measuring their DC conductivity galvanostatically in air. Since FTO is conductive only for electrons and blocking to ions, the measured equilibrium potential corresponds to the electronic conductivity of NCN-PHI alone. The measurement results are shown in FIG. 16b. After an equilibration period of 30 s at 0 nA, a current of 100 nA has been forced through the sandwich for 120 s. Afterwards, the current was set back to 0 nA. During the whole process, the voltage drop over the sample was recorded. Comparing the measurement in complete darkness to the one where the sample was illuminated (approx. 7 sun) during the 120 s period of current flow, a resistance reduction of NCN-PHI by a factor of as high as 45 is observed (27 MΩ in the dark compared to 600 kΩ under illumination). This indicates that light-induced electrons in the conduction band—even without the presence of a hole quencher—enhance the conductivity of the material significantly. It furthermore rationalizes why NCN-PHI photoelectrodes can be used more efficiently when charged by light rather than purely electronically, which is due to a decrease in resistive losses. While locally increased photoconductivity in melon-type carbon nitrides has been observed several times by means of impedance measurements and photocurrents, this represents the first direct evidence for enhanced long-range DC conductivity in carbon nitrides under illumination, to the best of our knowledge.

Hole Conductors & Towards a Hole Storage Material

This section focuses on engineering the hole transport and hole storage material. Different materials were first optimized for thin film preparation, followed by a study of electrochemical properties. Finally, deposition onto NCN-PHI coated FTO electrodes to form a half-cell multilayer system or a full-cell sandwich configuration was optimized and (photo) electrochemically analyzed.

PEDOT:PSS

As already mentioned above, PEDOT:PSS is a suitable conductive polymer as either HTM or HSM. In the following section, the implementation of this material is discussed.

Film Preparation

The film preparation on two different surfaces was studied: 1) pure FTO for measurements evaluating electrochemical properties (half-cell) and sandwich configurations in which PEDOT:PSS acts as HTM or HSM (full-cell); 2) NCN-PHI for separated full-cell measurements.

Deposition on Pure FTO

FTO (7×5 mm) was chosen as a substrate due to its roughness allowing easier deposition, better comparability to NCN-PHI samples deposited onto FTO and thickness allowing easier sandwiching. Details of drop casting and spin coating routines are given above. For drop casting, two different parameters were varied: Deposition amount and drying temperature. The amount of deposited material was controlled through increasing the concentration of the suspension, while keeping the amount of liquid constant. A homogeneous wetting of all samples is necessary, which was achieved with 10 μL. Two drying temperatures were chosen, 60 and 140° C. All drop cast substrates were contacted after coating. It was found that due to attractive interactions with epoxy, PEDOT:PSS accumulated at the border causing an inhomogeneous film. Spin coating allows to control spinning speed and duration. A fixed suspension amount of 10 μL was applied onto each sheet and subsequently, spinned at 3,000 rpm for a duration of 60 sec with an acceleration of 1,200 rpm s−1. The deposition amount was controlled by varying concentrations of the suspension due to similar reasons explained for drop casting above. Spin coating yields much smoother surfaces, although border effects are visible especially for high concentration samples. Drop casting requires a certain deposition amount to produce homogeneous surfaces: When depositing solutions of 0.5-0.7 wt %, most of the material accumulates in the middle, probably due to a very fast meniscus retraction preventing formation of a homogeneous film. To analyze the film topography, AFM measurements were performed on PEDOT:PSS coated FTO substrates. The roughness of spin coated samples using 10 μL of 3-4 wt.-% suspensions is larger than of drop cast ones using 10 μL of a 1-1.3 wt.-% concentrated suspension (approximately 4 nm and 1 nm, respectively). This observation can be explained through film thickness: As the substrate FTO is very rough a very thin film might not coat it completely, but only filling the voids in between the hills. During spin coating a lot of material is lost: The amount of substance deposited when using a solution of 3-4 wt.-% was measured with a quartz micro balance to be as high as 23.4 μg. Compared to drop casting, using a 0.5-0.7 wt.-% concentrated solution was calculated to be 38.4 μg. A possibility for further research to circumvent this problem is to use multiple spin coating cycles. Henceforth, spin coating was performed with the highest possible concentration (3-4 wt.-%) solutions and drop casting with the smallest concentration giving homogeneous films (1-1.3 wt.-%) for direct deposition on FTO.

Deposition on NCN-PHI Electrodes

Next, deposition procedures of PEDOT:PSS onto NCN-PHI films were briefly studied. Due to the much more inhomogeneous surface of a NCN-PHI film, only drop casting can be employed. For early samples, drop casting was performed on pre-contacted NCN-PHI films. However, as already explained above, PEDOT:PSS accumulates at epoxy border. This causes a very inhomogeneous surface. When using not yet contacted FTO substrates, drop casting was performed with 10 μg of a 1-1.3 wt.-% concentrated suspension to allow comparison with full-cell experiments using an PEDOT:PSS coated FTO electrode as HTM/HSM.

Electrochemical Analysis: Half-Cell Experiments

To assess, whether PEDOT:PSS is a suitable HTM and HSM, its electrochemical properties were studied. The redox behavior was analyzed using cyclic voltammetry on PEDOT:PSS coated FTO half-cells, produced via drop casting 10 μL of a 1-1.3 wt.-% concentrated suspension. To investigate the redox peak positions of the material, a relatively large potential window of −200 to +1000 mV was chosen. A reduction peak located at +410.0 mV and an oxidation peak at +675.0 mV against Ag/AgCl are visible, allowing the calculation of a redox potential of +542.5 mV vs Ag/AgCl (+739.5V vs SHE). A redox potential in a similar range was reported in literature. It is not possible to choose one characteristic value, as ratio between PEDOT and PSS strongly influences the potential. When converting this redox potential against the vacuum energy level, a value of 5.2 eV is obtained, which is by definition the Fermi level and very close to the valence band of PEDOT:PSS (at 5.2 eV). It shows that PEDOT:PSS is in fact p-doped, i.e., oxidized. This can be expected, as very conductive PEDOT:PSS was purchased. The dependence of conductivity on the amount of p-doping explains, why PEDOT:PSS is a hole transport and storage material for NCN-PHI in general. Electron absorption decreases conductivity. It remains to be investigated whether electron injection of NCN-PHI could have a negative impact on the polymer in long-term effects as the conductivity would decreases. When scanning positive, a large current increase at a potential of 1,000 mV was observed. This is attributed to water oxidation. During a blind experiment measuring solely a FTO sample against an Ag/AgCl counter electrode in a KCl electrolyte, a current increase was measured at around 1.1V vs Ag/AgCl, thus making this assumption reasonable. However, the increase was much smaller than with PEDOT:PSS, which would suggest that PEDOT:PSS is a better water oxidation catalyst. A further observation is the degradation of peak currents for both oxidation and reduction, indicating that films are not stable when cycling in such a large potential window. This observation was confirmed by literature: M. Marzocchi et al. reported that PEDOT:PSS films are only very stable when cycling between −200 and +600 mV vs SCE(−155 and 645 mV vs Ag/AgCl). If PEDOT:PSS is dissolving into the electrolyte, FTO is uncovered. Since FTO oxidizes water less efficiently than PEDOT:PSS, the peak current decrease can be explained.

An impedance analysis of PEDOT:PSS in the reduced and oxidized states was performed. To transfer the polymer into the respective state, a corresponding potential was applied for 30 seconds as pretreatment before each measurement. A potential of −0.4V for reduction and +0.7V for oxidation was chosen. A material resistance of 19.2 and 11.7 Ohm at −0.4 and +0.7 V, respectively, was measured. If one assumes a layer thickness of 1 µm, a conductivity of 52 and 85 S $cm^{-1}$, respectively, can be calculated, which aligns with the assumption of higher resistance in the reduced state. However, it also shows that PEDOT:PSS never fully reduced itself during the pretreatment as resistance is still very small. Thus, it can be expected that during cyclic voltammetry experiments, only a partial reduction took place.

Next, the ability of PEDOT:PSS to store charges depending on charging potential was evaluated. During a positive sweep, the material is oxidized or charged with holes and becomes more conductive. At a certain cation concentration, due to coulombic repulsion among each other, charging will saturate. The ordered PEDOT:PSS material used in this work is highly p-doped, as mentioned above. To evaluate the charging ability of PEDOT:PSS in the area between reduction peak of PEDOT:PSS and reduction of NCN-PHI, two separate CV measurements were performed, between 0 to +500 mV and 0 to −500 mV. 10 µL of a 1-1.3 wt.-% PEDOT:PSS suspension was drop cast onto FTO and CVs were measured in a half-cell three electrode setup against a Ag/AgCl reference electrode. The much more rectangular shape at the low potential window suggests a mainly capacitive charge storage mechanism. At higher potentials an increase of current at +500 mV is visible, which suggests a non-capacitive Faradaic charge transfer or storage mechanism. This observation is not surprising, as the maximum reached potential of +500 mV in this experiment is higher than the materials reduction potential of 410 mV. An reduction of PEDOT:PSS at this potential should therefore be possible. Whereas for the low potential window of −500 to 0 mV a coulombic efficiency of 90.7% was calculated, for the high potential window of 0 to +500 mV it is much smaller, only at 45.1%. This observation confirms the assumption that a lot of electrons are lost due to reduction of PEDOT:PSS.

As already reported in the upper part of this section, the drying temperature can have a significant influence on electrochemical performance. Two temperatures were chosen, 60° C. and 140° C. and CV measurements were carried out for both samples. Larger redox peaks are visible for higher drying temperatures. This leads to a higher performance of PEDOT:PSS.

Full Cell Experiments

The ability of PEDOT:PSS to act as a HTM and HSM in a full cell configuration was studied, using the sandwich approach. By controlling contact pressure, a connection of substrate and upper film via pinholes can be prevented. PEDOT:PSS was spin coated from a 1-1.3 wt.-% suspension onto FTO. Spin coating with a small concentration suspension was chosen as it yields more homogeneous surfaces and the sandwich approach is very sensible for inhomogeneous film heights. The sample was sandwiched with a NCN-PHI coated FTO substrate (35 µg), deposited via drop casting. Both half-cells were pressed together. To evaluate electrochemical properties, CV measurements were performed in a potential window of −500 to +500 mV. This window should allow both charging of NCN-PHI and oxidation as well as reduction of PEDOT:PSS and still ensure film stability. The measurement was performed at a much smaller scan rate of just 10 $mVs^{-1}$ to give the sample enough time to charge or discharge itself. The potential in such a full-cell two electrode setup is not referenced against Ag/AgCl as in half-cell experiments reported above, but against the other half-cell. A potential of 0 mV corresponds to the equal total cell voltage of OmV, a potential above zero means that the Fermi level of PEDOT:PSS rises above the Fermi level of NCN-PHI and vice versa. When comparing the anodic and cathodic potential sweeps, a different shape becomes visible: When scanning from +500 to −500 mV, a nearly linear current decrease is visible, whereas in opposite direction a redox peak is present at lower potentials. This may be explained with different charging efficiencies of NCN-PHI compared to PEDOT:PSS for electrons and holes: When −500 mV is reached, the negative current indicates a charging of NCN-PHI with electrons and PEDOT:PSS with holes. The positive current during the potential sweep in the opposite direction is linked to a discharge of NCN-PHI and charge of PEDOT:PSS with electrons, simultaneously discharging NCNPHI or oxidizing it. The fact that the initial slope of the anodic sweep at −500 mV is larger than of the cathodic sweep at +500 mV, suggests a more efficient electron storage on NCN-PHI than on PEDOT:PSS. This behavior is desired, as it shows that NCN-PHI acts as electron storage and PEDOT:PSS as hole storage material. However, if comparing the curve area for negative currents (NCN-PHI charging) and positive currents (NCN-PHI discharging), a larger area is present for positive currents. The small coulombic efficiency of 67% supports this observation. This means that parasitic reactions must take place, possibly a further oxidation of PEDOT:PSS or that the materials are not charged to the equilibrium yet.

To conclude, this experiment shows that a full-cell NCN-PHI PEDOT:PSS tandem is able to store and release charges. Note, that no hole transport material is required for this cell, although it could possibly increase charge storage stability. The potential leading to charging and discharging currents was applied only on a very short time frame (negative and positive potential sweeps of 50 sec each, causing a NCN-PHI charging and discharging current time of 79 sec and 121 sec, respectively), a self-discharge may therefore not be relevant for this experiment.

Photochemical Charging of NCN-PHI—PEDOT:PSS Solar Batteries

In the following section, photochemical properties of the NCN-PHI PEDOT:PSS full-cell tandem is analyzed. The sandwiched version of the NCN-PHI PEDOT:PSS full cell was synthesized by drop casting 10 µg of NCN-PHI onto a first FTO sheet and spin coating approximately 37 µg of PEDOT:PSS onto a second FTO substrate. Both substrates were then sandwiched together. Subsequently, the open circuit potential (OCP) was analyzed in dark conditions and under illumination with 1 sun. The OCP describes the potential, which is reached when no current flows through the cell. Chrono-potentiometric OCP measurements were performed, in which the potentiostat is held at a current of 0 mA throughout the entire measurement. The sample is illuminated with 1 sun in 2 min cycles of light and dark. A large OCP of 750 mV is observed right after the illumination starts. This can be explained by the previous mentioned accumulation of electrons in the conduction band while holes accumulate at the cathode side. Note that the maximum cell voltage possible calculated from the band positions is 1,300 mV (see FIG. 19). The measured value reaches 58% of this theoretical value. Losses might be explained with charge transfer resistance of the sample for hole transport between NCN-PHI and PEDOT:PSS and at both junctions to FTO. Furthermore, when turning off the illumination, the photopotential does not decrease immediately, but needs approximately 20 min to reach a potential of 0 mV. This phenomenon can be explained through electron storage on NCN-PHI and hole storage in PEDOT:PSS, the desired result.

Electrical Charging of NCN-PHI PEDOT:PSS Solar Batteries

In the following, the NCN-PHI PEDOT:PSS full-cell system was investigated towards electrical charging. A chronopotentiometric measurement was performed and a charging cycle of 100 nA, corresponding to 28 mAg$^{-1}$, with a duration of 20 min was carried out. Subsequently, the potentiostat was set to a current of 0 nA to evaluate the charge storage ability of the system. At the end of the charging cycle, a maximum potential of around 1,700 mV was reached, which is larger than the theoretical possible potential of 1,300 mV calculated from band positions when assuming that only the conduction band and not states above it are filled with electrons. When turning the charging current on, an immediate fast increase to around 1,000 mV and a subsequent slower increase to 1,700 mV is observed. After turning the current of, a rapid decrease of 1,000 mV and subsequent slower decreaseto 0 mV is observed.

This behavior can be explained when two different capacity mechanisms are taken into account: A very rapid capacitance process with a very small capacity and a slower process with a larger capacity. The fast process may be related to charges stored on the interface to FTO substrates, creating a dipole and acting similar to a parallel-plate capacitor. In this system NCN-PHI and PEDOT:PSS are acting as dielectric materials, which is reasonable due to the low conductivity of NCN-PHI. The slower process could be linked to charge storage within NCN-PHI and PEDOT:PSS itself. A potential increase of 700 mV can be attributed to charging of the material, which compares well to the observed photopotential of 750 mV.

To conclude, the NCN-PHI—PEDOT:PSS sample can not only create a potential through photoabsorption, but also through purely electrical charging. Furthermore, the system is able to store these charges for more than 50 min in OCP conditions.

Melon

Melon is a carbon nitride based on heptazine units. The band positions of both valence band and conduction band are located slightly higher in energy than of NCN-PHI. A full-cell system was created as follows: Melon films were prepared by drop casting 10 µL of a Melon suspension onto a FTO sheet and dried at 60° C. This process was repeated once to ensure a complete coating of the substrate. 35 µg of NCN-PHI was drop cast onto a second FTO sheet and dried at 60° C. Both samples were sandwiched together (see FIGS. 22-24). In order to understand electrochemical properties of this system and compare Melon hole storage efficiency to PEDOT:PSS, a CV measurement was performed. The measurement was carried out at a slow scan rate of 10 mVs$^{-1}$ to give the system enough time for charging. The same scan rate was chosen for the NCN-PHI PEDOT:PSS full-cell system discussed above. Looking at the shape of the CV curve, a roughly linear behavior of the cathodic potential sweep from +600 to −600 mV is observed. However, the sweep in the opposite anodic direction is more capacitive. This may give a hint on different storage mechanisms: When looking at the area of negative current, a charging of NCN-PHI with electrons and Melon with holes takes place. The subsequent discharge has very rough similarities with a pseudocapacitive behavior due to the fast current increase to around 0 mV and subsequent leveling of the curve. This is the desired result, as it shows that electrons are stored better on NCN-PHI than on Melon. This result is similar to the observations made on NCN-PHI—PEDOT:PSS full-cell, where electrons are also stored more efficiently on NCN-PHI than on PEDOT:PSS. The area under the charging and discharging curve is similar, which means that no charge is lost through unwanted side reactions. The high coulombic efficiency of 84% underlines this observation.

To conclude, charge storage in the analyzed potential window of +500 to −500 mV is possible in the desired way, meaning electrons are stored on NCN-PHI and holes on Melon. This experiment shows, that a full solar battery based on purely carbon nitrides is indeed possible. Melon is capable of storing holes qualitatively.

Photochemical Charging of NCN-PHI—Melon Solar Batteries

To evaluate photochemical charging of the NCN-PHI Melon full-cell system, the open circuit potential in light and in dark was measured (see FIG. 23). The sample was put into dark conditions and predefined illumination cycles with a duration of 2 minutes were carried out with an intensity of 1 sun, followed by a long period in the dark. A photo potential of −850 mV is reached with the Melon sample. To conclude, the NCN-PHI—Melon full-cell system is able to create a photopotential upon illumination.

Towards a Complete Solar Battery: PCBM as HTM

To increase charge storage stability, a HTM should be deposited between electron and hole storage material to separate the charges more efficiently during photocharging and to prevent subsequent recombination. An attempt was made to create a complete solar battery using both, HTM and HSM. The NCN-PHI Melon full-cell for electron and respective hole storage was chosen. Due to the small energy difference between both valence bands, PEDOT:PSS could not be used as a hole transport material. Therefore, a different material was chosen with a conduction band exactly in between both bands: [6,6]-phenyl-C61-butyric acid methyl ester (PCBM) (see FIG. 24). In the following a full solar battery is presented using a FTO sheet, which is coated with 35 µg NCN-PHI applied via drop casting and dried at 60° C. A subsequent layer of 10 µg PCBM is applied via drop casting and this bilayer system is sandwiched with a Melon coated second FTO sheet. CV measurements of this sample were performed using different scan rates (see FIG. 24). The rhomboid shape of the CV curves indicates a resistive capacitance mechanism. A pseudocapacitive contribution of the material was thus observed In conclusion, photochemical charging is possible. An explanation for this behavior can be made when taking the PCBM hole transport contribution into account. Furthermore, a charge storage stability during a time period of more than 50 min is observed. Note that this storage time is much better compared to the 20 min of the NCN-PHI—Melon cell. This indicates an enhancement in charge separation due to PCBM. In conclusion, a solely carbon nitride full solar battery based on NCN-PHI as electron storage and Melon as hole storage material is able to produce a photopotential and store these charges. The fabrication of an autophotorechargable full solar battery, consisting of purely heptazine based charge storage materials is thus possible.

The invention claimed is:

1. An autophotorechargeable battery comprising
    a negative electrode comprising a substrate with a surface and a layer comprising an electron storage material provided on the surface of the substrate, wherein the electron storage material is a nitrogen-containing electron storage material and/or has a two-dimensional or a three-dimensional covalent structure, and wherein the electron storage material can absorb light to excite electrons and store the exited electrons therein;
    a positive electrode comprising a substrate with a surface, and a layer comprising a hole storage material provided on the surface of the substrate, and
    an electrolyte.

2. The autophotorechargeable battery according to claim 1, wherein the electron storage material is capable of intercalating and de-intercalating cations.

3. The autophotorechargeable battery according to claim 1, wherein the electron storage material has a band gap in the range of 0.5 to 3.5 eV.

4. The autophotorechargeable battery according to claim 1, wherein a layer of a hole transport material is sandwiched between the electron storage material and the hole storage material.

5. The autophotorechargeable battery according to claim 4, wherein the hole transport material is selected from the group consisting of polynaphthalenes, polyphenylenes, polyphenylene vinylenes, polyparaphenylene, polyparaphenylene sulfide, polyparaphenylene vinylene, polyanilines, polypyrroles, polycarbazoles, polyindoles, polyazepines, polythiophenes, polyisothianaphthene, polyacetylenes, polyazulenes, poly(3,4-ethylenedioxythiophene), carbon nitrides, quinones, copolymers of thiophenes with polyfluorenes, polycarbazoles, polydibenzosiloles, benzothiadiazoles or diketopyrrolopyrroles; copolymers of selenophenes with polyfluorenes, polycarbazoles or polydibenzosiloles; benzothidiazole, diketopyrrolopyrrol, compounds comprising N—O-bonded oxygen as radical center, quinone-based acenes, compounds comprising carbon centered radical cations, compounds comprising tertiary amine centered radicals, and doped variants thereof.

6. The autophotorechargeable battery according to claim 1, wherein the electrolyte is a liquid electrolyte comprising a redox shuttle, and wherein the electron storage material and the hole storage material are both in contact with the liquid electrolyte.

7. The autophotorechargeable battery according to claim 1, wherein an electron transport material is provided between the nitrogen-containing electron storage material and the substrate of the negative electrode.

8. The autophotorechargeable battery according to claim 1, wherein the electron storage material is a nitrogen-containing electron storage material comprising heptazine and/or triazine moieties.

9. The autophotorechargeable battery according claim 1, wherein the electron storage material is a covalent organic framework (COF) or metal organic framework (MOF).

10. The autophotorechargeable battery according to claim 1, wherein the electron storage material has a band gap in the range of 1.0 to 2.0 eV, or of 2.0 to 3.0 eV.

11. The autophotorechargeable battery according to claim 1, wherein the electron storage material is a nitrogen-containing electron storage material and a layer of the nitrogen-containing electron storage material comprises the nitrogen-containing electron storage material in an amount of at least 80 wt.-% in terms of the weight of the layer.

12. An autophotorechargeable battery comprising
    a negative electrode comprising a substrate with a surface and a layer comprising an electron storage material provided on the surface of the substrate,
    a positive electrode comprising a substrate with a surface, and a layer comprising a hole storage material provided on the surface of the substrate, and
    an electrolyte,
    wherein the hole storage material has a band gap in the range of 0.5 to 3.5 eV, and
    wherein the hole storage material is a nitrogen-containing material and/or has a two-dimensional or a three-dimensional covalent structure, and
    wherein the hole storage material can absorb light to excite electrons and holes, and store the photogenerated holes.

13. The autophotorechargeable battery according to claim 12, wherein a layer of an electron transport material is sandwiched between the electron storage material and the hole storage material.

14. The autophotorechargeable battery according to claim 12, wherein the hole storage material is capable of intercalating and de-intercalating cations and/or anions.

15. The autophotorechargeable battery according to claim 12, wherein the electrolyte is a liquid electrolyte comprising a redox shuttle, and wherein the electron storage material and the hole storage material are both in contact with the liquid electrolyte.

* * * * *